(12) United States Patent
Koc et al.

(10) Patent No.: US 7,501,745 B2
(45) Date of Patent: Mar. 10, 2009

(54) PIEZOELECTRIC VIBRATOR

(75) Inventors: Burhanettin Koc, Suwon (KR); Dong Kyun Lee, Seoul (KR); Jung Ho Ryu, Suwon (KR); Byung Woo Kang, Seoul (KR)

(73) Assignee: Samsung Electro-Mechanics Co., Ltd., Suwon-si, Gyunggi-do (KR)

( * ) Notice: Subject to any disclaimer, the term of this patent is extended or adjusted under 35 U.S.C. 154(b) by 0 days.

(21) Appl. No.: 11/688,658

(22) Filed: Mar. 20, 2007

(65) Prior Publication Data

US 2007/0236106 A1 Oct. 11, 2007

(30) Foreign Application Priority Data

Apr. 6, 2006 (KR) .................. 10-2006-0031621

(51) Int. Cl.
*H03H 41/047* (2006.01)
(52) U.S. Cl. .................. 310/365; 310/311; 310/316
(58) Field of Classification Search ............. 310/311, 310/365, 316, 328, 366
See application file for complete search history.

(56) References Cited

U.S. PATENT DOCUMENTS

| | | | | |
|---|---|---|---|---|
| 6,060,819 | A * | 5/2000 | Tagami et al. | 310/366 |
| 6,605,887 | B2 * | 8/2003 | Takeuchi et al. | 310/321 |
| 6,720,711 | B2 * | 4/2004 | Iino et al. | 310/332 |
| 2001/0045793 | A1 * | 11/2001 | Misu et al. | 310/364 |
| 2004/0189155 | A1 * | 9/2004 | Funakubo | 310/366 |
| 2005/0062367 | A1 | 3/2005 | Funakubo et al. | |
| 2006/0061241 | A1 | 3/2006 | Sasaki | |

FOREIGN PATENT DOCUMENTS

| | | |
|---|---|---|
| JP | 07-273384 A | 10/1995 |
| JP | 2004-297951 A | 10/2004 |
| WO | 00/74153 A1 | 12/2000 |

OTHER PUBLICATIONS

English Translation of United Kingdom foreign Search Report.

* cited by examiner

*Primary Examiner*—Quyen P Leung
*Assistant Examiner*—Bryan P Gordon
(74) *Attorney, Agent, or Firm*—Lowe Hauptman Ham & Berner

(57) ABSTRACT

A piezoelectric vibrator that generates an elliptical motion using a combination of a longitudinal vibration and a flexural vibration includes a piezoelectric element, three side electrodes, and a power transmission member. The piezoelectric element includes three piezoelectric element layers. The first and second side electrodes electrically connect electrode patterns formed in a diagonal direction among the electrode patterns formed in the first and third piezoelectric element layers of the piezoelectric element, and the third side electrode electrically connects an internal ground electrode of the second piezoelectric element layer to the bottom electrode of the third piezoelectric element layer. The power transmission member is formed in one side of the piezoelectric element to transmit vibration generated from the piezoelectric element to the outside.

19 Claims, 25 Drawing Sheets

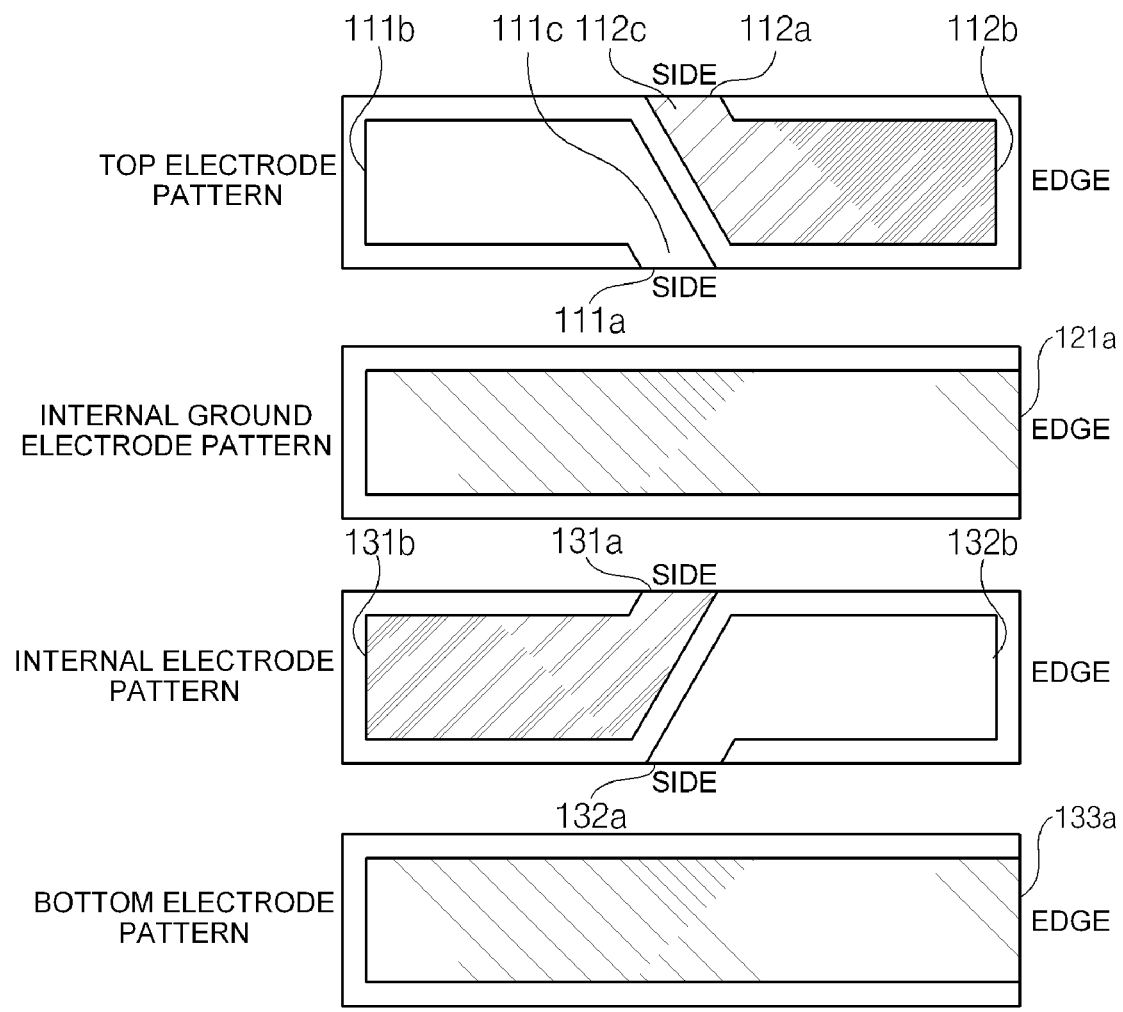

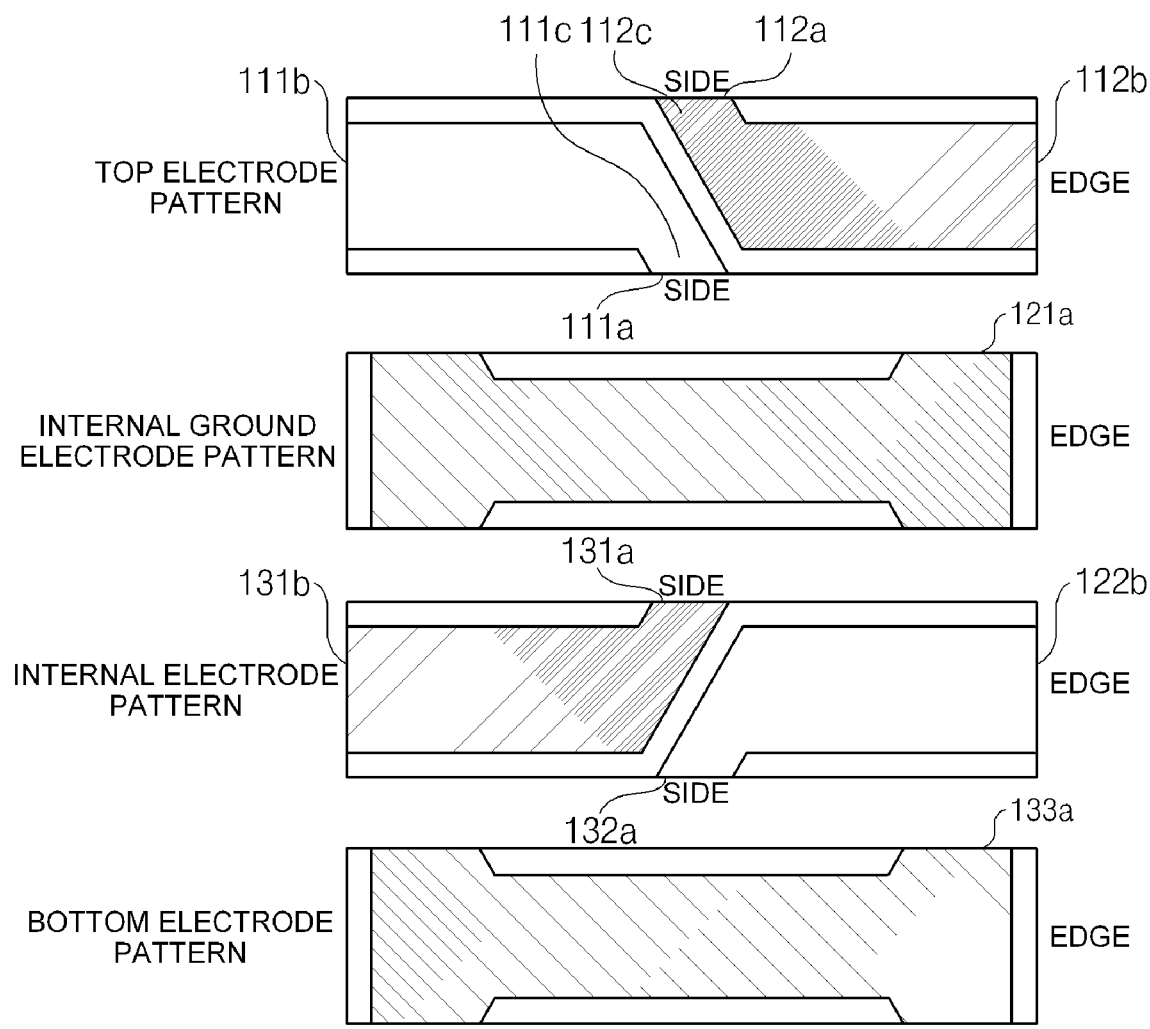

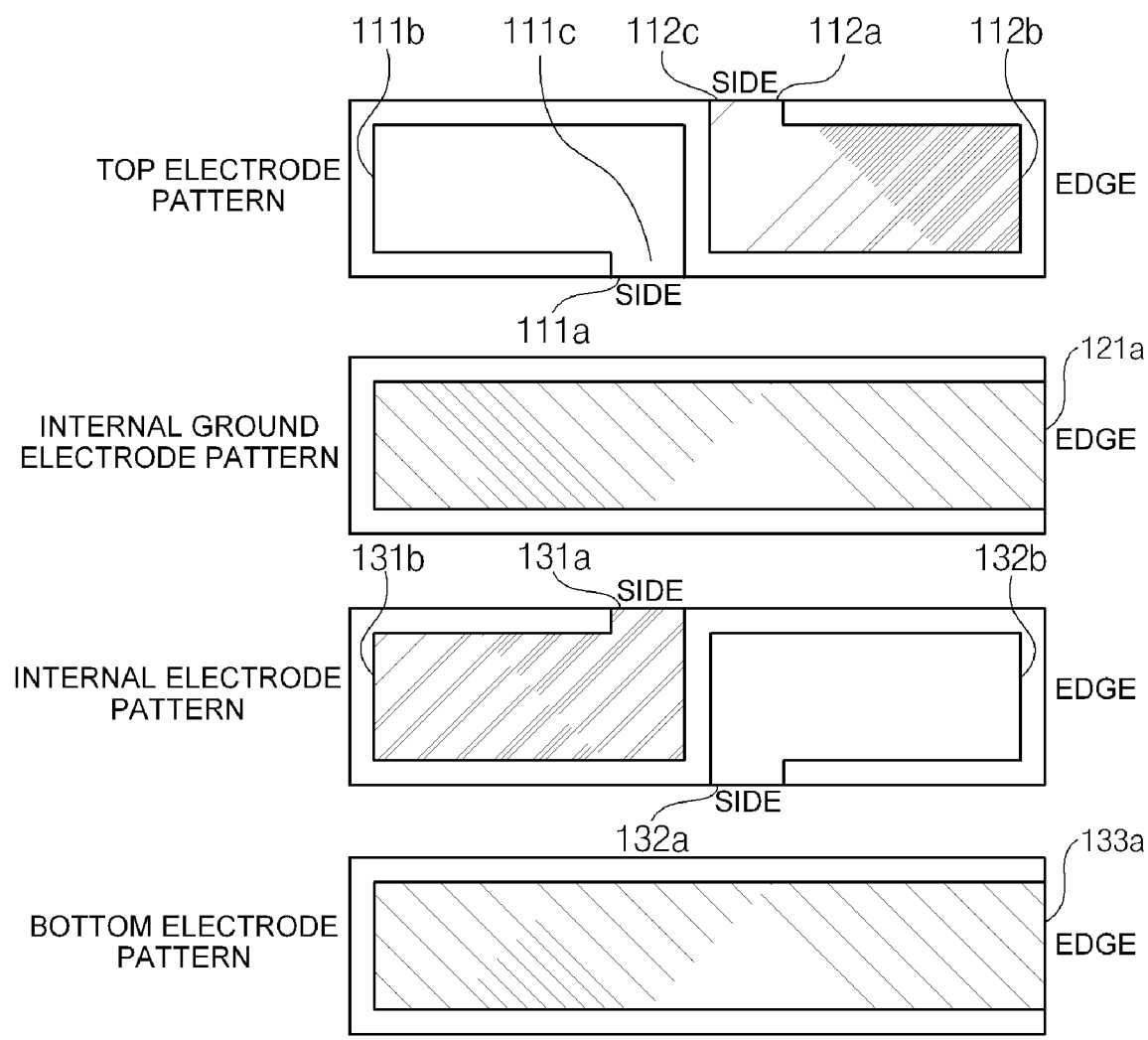

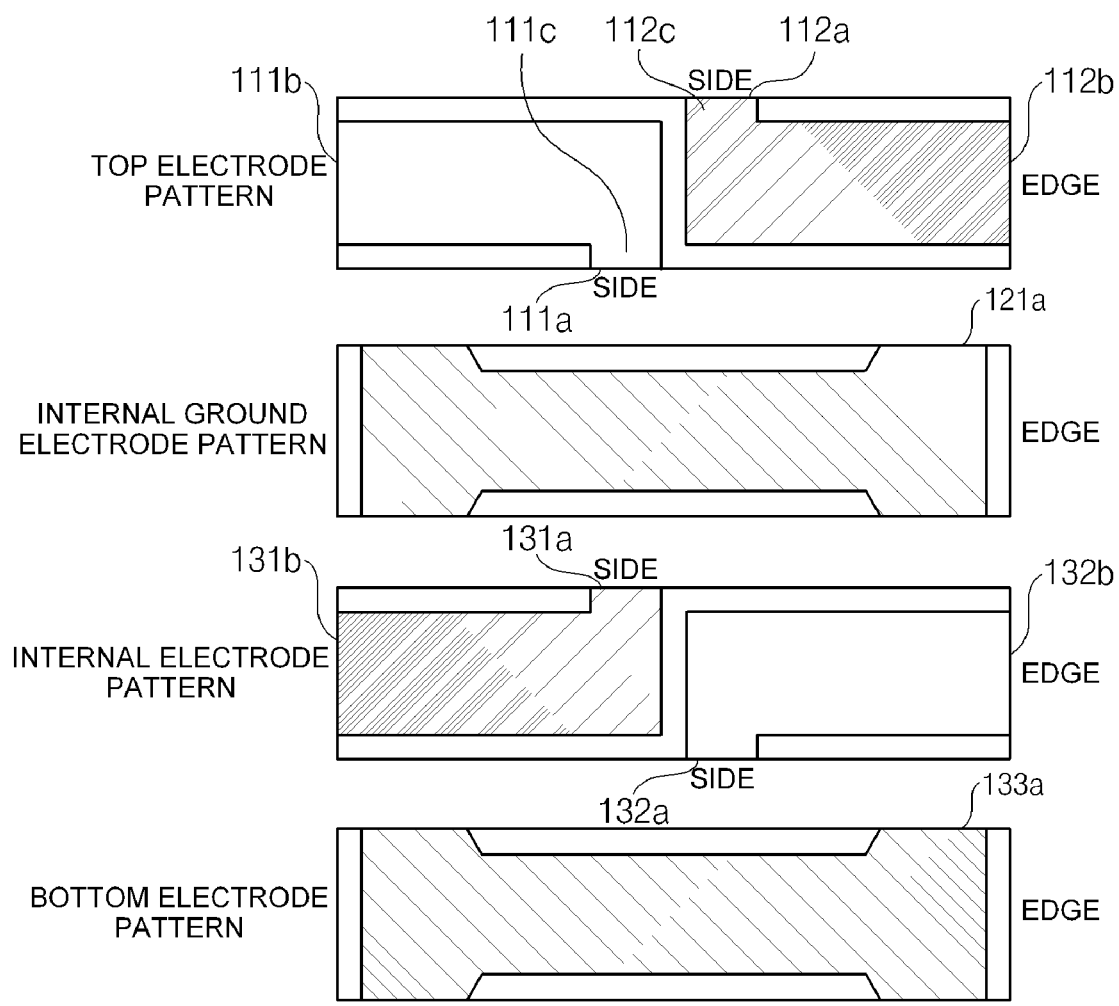

630

600

610

620

630

630

PIEZOELECTRIC VIBRATOR

CROSS-REFERENCE TO RELATED APPLICATIONS

This application claims the benefit of Korean Patent Application No. 10-2006-0031621 filed with the Korea Intellectual Property Office on Apr. 6, 2006, the disclosure of which is incorporated herein by reference.

BACKGROUND OF THE INVENTION

1. Field of the Invention

The present invention relates to a piezoelectric vibrator, and more particularly, to a piezoelectric vibrator that can finely drive a device within a small limited space such as a portable electronic device by generating an elliptical motion using a combination of a longitudinal vibration and a flexural vibration.

2. Description of the Related Art

In recent years, an ultrasonic motor using a piezoelectric vibrator is considered as a new motor replacing an electromagnetic motor. Compared with the electromagnetic motor, the ultrasonic motor using the piezoelectric vibrator has an excellent resolution and a reduced noise and generates no magnetic field.

A piezoelectric element generates a strain with respect to an applied electric field or generates a voltage with respect to a stress. A piezoelectric vibrator or a piezoelectric stator using the piezoelectric element is driven at a resonance frequency ranging from several tens of kHz to several hundreds of kHz, and can transfer an amplified strain to a rotor through a stacked structure or a strain expansion structure. Such a piezoelectric element itself can be used as a vibrator, or it can be combined with a structure having a specific shape.

A piezoelectric ultrasonic motor using the piezoelectric element has a traveling wave driving scheme and a standing wave driving scheme. The piezoelectric ultrasonic motor is driven using a principle of superposing two driving waves having a predetermined phase difference.

Conventional piezoelectric ultrasonic motors are disclosed in U.S. Pat. No. 6,720,711, U.S. Patent Publication No. 2004/0189155, and Japanese Laid-open Patent Publication No. 2004-297951.

U.S. Patent Publication No. 2004/0189155 and Japanese Laid-open Patent Publication No. 2004-297951 provide a piezoelectric ultrasonic vibrator for miniaturization. To this end, conductive films for electrically connecting external electrodes of a first external electrode group to external electrodes of a second external electrode group are formed in close contact with the surface of the ultrasonic vibrator.

However, the conductive films must be formed on the surface of the small-sized vibrator having a rectangular parallelopiped shape. Therefore, there is a limitation in miniaturization of the ultrasonic vibrator. In addition, there is a problem in miniaturization because a plurality of side electrodes used for the external electrode are formed.

Due to the size characteristic of the external electrode, it is practically difficult to form the conductive films on the surface of the vibrator so as to electrically connect the external electrodes of the first external electrode group to the external electrodes of the second external electrode group. An electric short degrades the reliability of product and the production yield.

A problem of the related art including U.S. Pat. No. 6,720,711, U.S. Patent Publication No. 2004/0189155, and Japanese Laid-open Patent Publication No. 2004-297951 is to secure a wire connection in a piezoelectric vibrator body. As the size of the vibrator is decreasing, an electric wiring becomes an important issue. When 0.1 μm strain occurs in the piezoelectric vibrator and a vibration frequency is 250 kHz, an acceleration influencing a solder dot is more than about 200,000 mm/s$^2$. Based on this fact, in the case of a small-sized vibrator where a solder dot is not placed at a nodal point (a position that does not move during vibration), the high acceleration weakens a solder strength, causing a serious problem in operation of the piezoelectric vibrator.

SUMMARY OF THE INVENTION

An advantage of the present invention is that it provides a small-sized piezoelectric vibrator that can provide high efficiency and be manufactured at low cost by using a simpler structure with a least side electrode and without an additional conductive film.

Another advantage of the present invention is that it provides a piezoelectric vibrator that can cope with various vibration frequency variations for mass production by soldering the wire in order to apply the AC voltage to the nodal point of the piezoelectric vibrator and can further improve the reliability of the piezoelectric vibrator.

A further advantage of the present invention is that it provides a method for manufacturing a piezoelectric vibrator, which can be manufactured in small size at low cost and can be mass-produced.

Additional aspect and advantages of the present general inventive concept will be set forth in part in the description which follows and, in part, will be obvious from the description, or may be learned by practice of the general inventive concept.

According to an aspect of the invention, a piezoelectric vibrator includes: a piezoelectric element including a first piezoelectric element layer having a bisected top electrode formed thereon, a second piezoelectric element provided under the first piezoelectric element layer and having an internal ground electrode formed thereon, and a third piezoelectric element provided under the second piezoelectric element layer, the third piezoelectric element having an internal electrode symmetrical with the top electrode with respect to a stack plane, and a bottom electrode formed in a plane opposite to the plane where the internal electrode is formed; a side electrode including first and second side electrodes for electrically connecting electrode patterns formed in a diagonal direction among the electrode patterns formed in the first and third piezoelectric element layers of the piezoelectric element, and a third side electrode for electrically connecting the internal ground electrode of the second piezoelectric element layer to the bottom electrode of the third piezoelectric element layer; and a power transmission member formed in one side of the piezoelectric element to transmit vibration generated from the piezoelectric element to the outside.

According to another aspect of the present invention, a piezoelectric vibrator includes: a piezoelectric element including an N-layer stacked structure including a plurality of first piezoelectric element layers where bisected top electrodes are formed and a plurality of second piezoelectric element layers where internal ground electrodes are formed, the first piezoelectric element layers and the second piezoelectric element layers being alternately stacked in sequence, and an M-layer stacked structure provided under the N-layer stacked structure, the M-layer stacked structure having a plurality of third piezoelectric element layers where internal electrodes are formed symmetrical with the top electrodes of the first piezoelectric element of the N-layer stacked structure with respect to a stack plane, and a plurality of second piezoelectric element layer stacked on the N-layer stacked structure, the third piezoelectric element layers and the second piezoelectric element layers being alternately stacked downward in sequence, the third piezoelectric element layer being disposed at the lowermost of the M-layer stacked structure; a side electrode including first and second side electrodes for electrically connecting electrode patterns disposed in a diagonal direction among the electrode patterns formed in the N-layer and M-layer stacked structures of the piezoelectric element, and a third side electrode for electrically connecting the internal ground electrodes of the N-layer and M-layer stacked structures and the bottom electrode of the M-layer stacked structure; and a power transmission member formed in one side of the piezoelectric element to transmit vibration generated from the piezoelectric element to the outside.

According a further aspect of the present invention, each of the top electrode and the internal electrode of the piezoelectric element comprises a bent pattern such that one ends adjacent to one another among the bisected patterns extend up to an outside of the piezoelectric element in an opposite direction from a center portion of the piezoelectric element.

According to a further aspect of the present invention, portions of the internal ground electrode and the bottom electrode of the piezoelectric element extend up to the outside of the piezoelectric element.

According to a further aspect of the present invention, predetermined portions of the internal ground electrode and the bottom electrode extend up to an edge of the piezoelectric element, the third side electrode being formed in a lateral end of the piezoelectric element.

According to a further aspect of the present invention, predetermined portions of the internal ground electrode and the bottom electrode extend up to a lateral end of the piezoelectric element, the third side electrode being formed in the same side as the side where the first or second side electrode is formed.

According to a further aspect of the present invention, each of the top electrode and the internal electrode of the piezoelectric element comprises a bent pattern such that one ends adjacent to one another among the bisected patterns extend up to an outside of the piezoelectric element in an opposite direction from a center portion of the piezoelectric element, and another ends that are not adjacent to one another extend up to an outside of the piezoelectric element.

According to a further aspect of the present invention, the internal ground electrode and the bottom electrode of the piezoelectric element extend up to lateral outsides of the piezoelectric element, and the third side electrode is formed in the same side as the side where the first or second side electrode is formed.

According to a further aspect of the present invention, the bent pattern is bent at a right angle.

According to a further aspect of the present invention, the piezoelectric vibrator further includes a solder dot for applying an electric signal to nodal points of the top electrode and the bottom electrode of the piezoelectric element.

According to a further aspect of the present invention, the piezoelectric vibrator further includes a solder dot for applying an electric signal to nodal points of the top electrode and the bottom electrode of the piezoelectric element.

According to a further aspect of the present invention, the piezoelectric vibrator further includes a solder dot for applying an external AC voltage to the center portion of the bottom electrode of the piezoelectric element.

According to a further aspect of the present invention, the side electrode extends to an inside of the side where the bottom electrode is not formed, without contacting the bottom electrode, such that solder dots are formed on the bottom surface of the piezoelectric element to apply an external AC voltage.

According to a further aspect of the present invention, the external AC voltage is applied using an FPCB, the FPCB being connected to the solder dots formed on the bottom surface of the piezoelectric element.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 3A to 3D are plan views showing patterns of internal electrodes, top electrodes, and bottom electrodes according to an embodiment of the present invention;

DETAILED DESCRIPTION OF THE PREFERRED EMBODIMENTS

Figure 1:
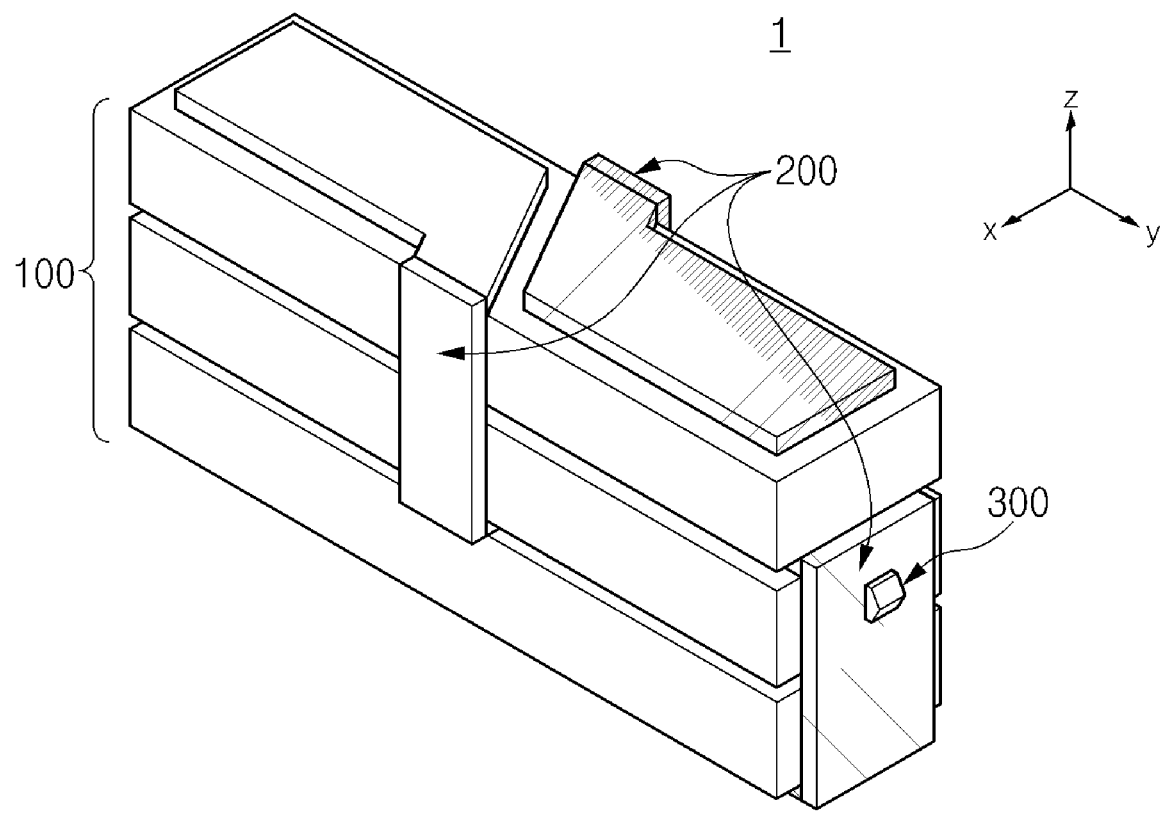
FIG. 1 is a perspective view of a piezoelectric vibrator according to an embodiment of the present invention.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Figure 2:
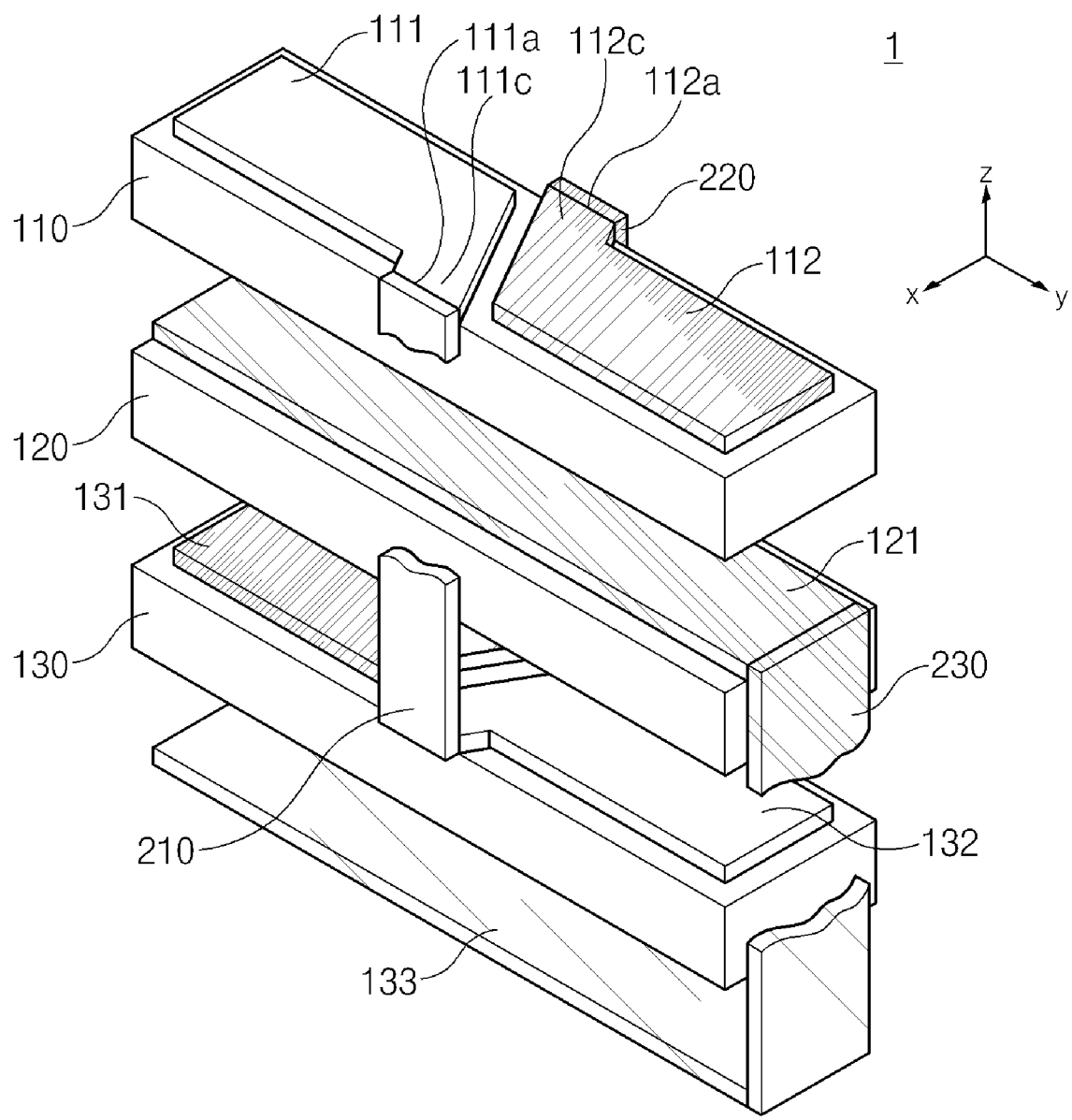
FIG. 2 is an exploded perspective view of the piezoelectric vibrator shown in FIG. 1.

FIG. 1 is a perspective view of a piezoelectric vibrator according to an embodiment of the present invention, and FIG. 2 is an exploded perspective view of the piezoelectric vibrator shown in FIG. 1.

Referring to FIG. 1, the piezoelectric vibrator 1 includes a piezoelectric element having four vibration parts, an internal electrode pattern, an external electrode pattern, and a power transmission member.

As shown in FIGS. 1 and 2, the piezoelectric element 100 includes first to third piezoelectric element layers 110, 120 and 130 stacked in sequence.

Top electrodes 111 and 112 having patterns divided by two are formed on the first piezoelectric element layer 110. The top electrodes 111 and 112 are external electrode patterns exposed to the outside and are soldered with a wire for applying an AC voltage from a voltage source.

An internal ground electrode 121 is formed on the second piezoelectric element layer 120 stacked under the piezoelectric element layer 110.

In addition, internal electrodes 131 and 132 are formed on the top surface of the third piezoelectric element layer 130 stacked under the second piezoelectric element layer 120. A bottom electrode 133 is formed on the bottom surface of the third piezoelectric element layer 130. The bottom electrode 133 is an external electrode pattern exposed to the outside and is soldered with an external ground terminal through a wire.

As shown in FIG. 2, the internal electrodes 131 and 132 formed in the third piezoelectric element layer 130 have patterns symmetrical with the top electrodes 111 and 112 formed on the first piezoelectric element layer 110 with respect to a plane (xy plane) where the piezoelectric element layers are stacked.

The first piezoelectric element layer 110 of the piezoelectric element 100 is disposed above the second piezoelectric element layer 120 and includes two vibration parts divided into the left and right sides.

That is, the piezoelectric element 100 includes a plurality of vibration parts divided into the left and right sides and the upper and lower sides with respect to the stacked direction of the piezoelectric element.

As shown in FIG. 2, the external electrodes exposed to the outside of the piezoelectric element 100 include the top electrodes 111 and 112, the side electrodes 200, and the bottom electrode 133.

The top electrodes 111 and 112 formed in the first piezoelectric element layer 110 are formed in an inside of the piezoelectric element so that it cannot extend up to the edge of the first piezoelectric element layer 110. One ends 111a and 112a of the adjacent sides in the bisected top electrode patterns 111 and 112 have bent patterns 111c and 112c so that they extend up to the outside of the piezoelectric element in the opposite lateral direction from the center. These patterns have the symmetrical shape with respect to the center of the piezoelectric element.

The horizontally bisected top electrode patterns 111 and 112 serve as the first channel CH1 and the second channel CH2 for applying an AC voltage, respectively.

Because the bent portions 111c and 112c of the top electrodes 111 and 112 extending up to the edge of the piezoelectric element are formed up to the side edge of the first piezoelectric element layer 110, the first and second side electrodes 210 and 220 formed on both sides of the piezoelectric element 100 are electrically connected to each other.

The first and second side electrodes 210 and 220 electrically connect the patterns 111 and 132 or 112 and 131 disposed in a diagonal direction among the patterns formed in the first and third piezoelectric layers 110 and 130, such that the patterns are operated at the same time. That is, as shown in FIG. 2, the left pattern 111 formed in the first piezoelectric element layer 110 is electrically connected to the right pattern 132 formed in the third piezoelectric element layer 130 by the first side electrode 210. Likewise, the right pattern 112 formed in the first piezoelectric element layer 110 is electrically connected to the second side electrode 220 and the left pattern 131 formed in the third piezoelectric element layer 130. Due to this connection, the AC voltage can be simultaneously applied to the vibration parts disposed in a diagonal direction through the top electrodes 111 and 112 for the first channel CH1 and the second channel CH2 of the first piezoelectric element layer 110.

Meanwhile, because the first and second side electrodes 210 and 220 are formed on both sides of the piezoelectric element 100, respectively, there is almost no probability that the electric short will occur. In addition, it is possible to prevent the side electrode 200 from being separated due to the vibration because the first and second side electrodes 210 and 220 are attached to both sides with a sufficient width.

The bottom electrode 133 formed on the bottom surface of the third piezoelectric element layer 130 acts as a ground terminal, the bottom electrode 133 is electrically connected to the internal ground electrode 121 formed in the second piezoelectric element layer 120 through the third side electrode 230. The third side electrode 230 has only to be formed at a position where the top electrodes 111 and 112 and the internal electrodes 131 and 132 are insulated. For example, the third side electrode 230 may be formed in the side or edge of the piezoelectric element 100.

In addition, a portion of the bottom electrode 133 must be formed up to the side or edge of the third piezoelectric element layer 130 so that the bottom electrode 133 can be electrically connected to the third side electrode 230. At this point, it is preferable that the bottom electrode 133 and the internal ground electrode 121 have the same shape because the bottom electrode 133 must be connected to the internal ground electrode 121 through the third side electrode 230.

As shown in FIG. 2, the internal electrode pattern includes the internal ground electrode 121 and the internal electrodes 131 and 132.

The internal ground electrode 121 formed in the second piezoelectric element layer 120 extends up to the side or edge of the second piezoelectric element layer 120. At this point, it is preferable that the internal ground electrode 121 and the bottom electrode 133 have the same shape because the internal ground electrode 121 is electrically connected to the bottom electrode 133 formed on the bottom surface of the third piezoelectric element layer 130.

Like the top electrodes 111 and 112, the internal electrodes 131 and 132 formed in the third piezoelectric element layer 130 have the horizontally bisected patterns. The internal electrodes 131 and 132 are symmetrical with the top electrodes 111 and 112 formed in the first piezoelectric element layer 110 with respect to the plane (xy plane) where the piezoelectric element is stacked. Therefore, among the patterns formed in the first and third piezoelectric element layers 110 and 130, the patterns 111 and 132 or 112 and 131 disposed in a diagonal direction are electrically connected to each other by the first and second side electrodes 210 and 220. That is, the right pattern 132 formed in the third piezoelectric element layer 130 is connected to the left pattern 111 formed in the first piezoelectric element layer 110 by the first side electrode 210. Likewise, the left pattern 131 formed in the third piezoelectric element layer 130 is connected to the right pattern 112 formed in the first piezoelectric element layer 110 by the second side electrode 220.

As shown in FIG. 1, the power transmission member 300 is formed in one side of the piezoelectric element 100 and transmits the vibration generated by the vibration part to the outside.

The power transmission member 300 may be formed in the right side, or may be formed on the plane where the first or second side electrode 210 and 220 is formed or a plane where the bottom electrode is formed, depending on the vibration characteristic of the vibration parts. Although one power transmission member 300 is installed in FIG. 1, a plurality of power transmission members can also be installed.

FIGS. 3A to 3D are plan views of patterns of internal electrodes, top electrodes, and bottom electrodes according to an embodiment of the present invention. Although the patterns and their combinations can be modified in various ways, the top electrodes 111 and 112 and the internal electrodes 131 and 132 having a shape symmetrical with the top electrodes 111 and 112 have the bent patterns 111c, 112c, 131c and 132c such that one ends 111a, 112a, 131a and 132a adjacent to one another among the divided patterns of the first and third piezoelectric element layers 110 and 130 extend up to the edge of the piezoelectric element in an opposite direction from the center of the piezoelectric element.

Referring to FIG. 3A, as one example of the combinations, predetermined portions of the internal ground electrode 121 and the bottom electrode 133 extend up to the edge of the piezoelectric element. Therefore, the third side electrode 230 is formed in the end side of the piezoelectric element. In this case, the top electrodes 111 and 112 and the internal electrodes 131 and 132 must be formed such that they do not extend up to the end of the piezoelectric element in order not to electrically contact the third side electrode 230.

Referring to FIG. 3B, unlike in FIG. 3A, predetermined portions of the internal ground electrode 121 and the bottom electrode 133 extend up to the side edge of the piezoelectric element. Therefore, the third side electrode 230 is formed in the same plane in which the first side electrode 210 or the second side electrode 220 is formed.

In this case, the patterns of the top electrodes 111 and 112 and the internal electrodes 131 and 132 may extend up to the edge of the piezoelectric element. That is, the top electrodes 111 and 112 and the internal electrodes 131 and 132 are formed inside the piezoelectric element such that they do not extend up to the outside of the first and third piezoelectric element layers 110 and 130. Meanwhile, one ends 111a, 112a, 131a and 132a adjacent to one another among the horizontally divided patterns have the bent patterns 111c, 112c, 131a and 132a such that they extend up to the outside of the piezoelectric element in an opposite direction from the center of the piezoelectric element. Another ends 111b, 112b, 131b and 132b that are not adjacent to one another among the divided patterns have patterns extending up to the edge of the piezoelectric element.

FIGS. 3C and 3D show the electrode patterns combined in the same way as those of FIGS. 3A and 3B. However, a difference is that the bent patterns of the top electrodes 111 and 112 and the internal electrodes 131 and 132 form a right angle with one another.

An operation of the piezoelectric vibrator 1 according to the present invention will be described below with reference to FIGS. 4 to 6.

Figure 4A:
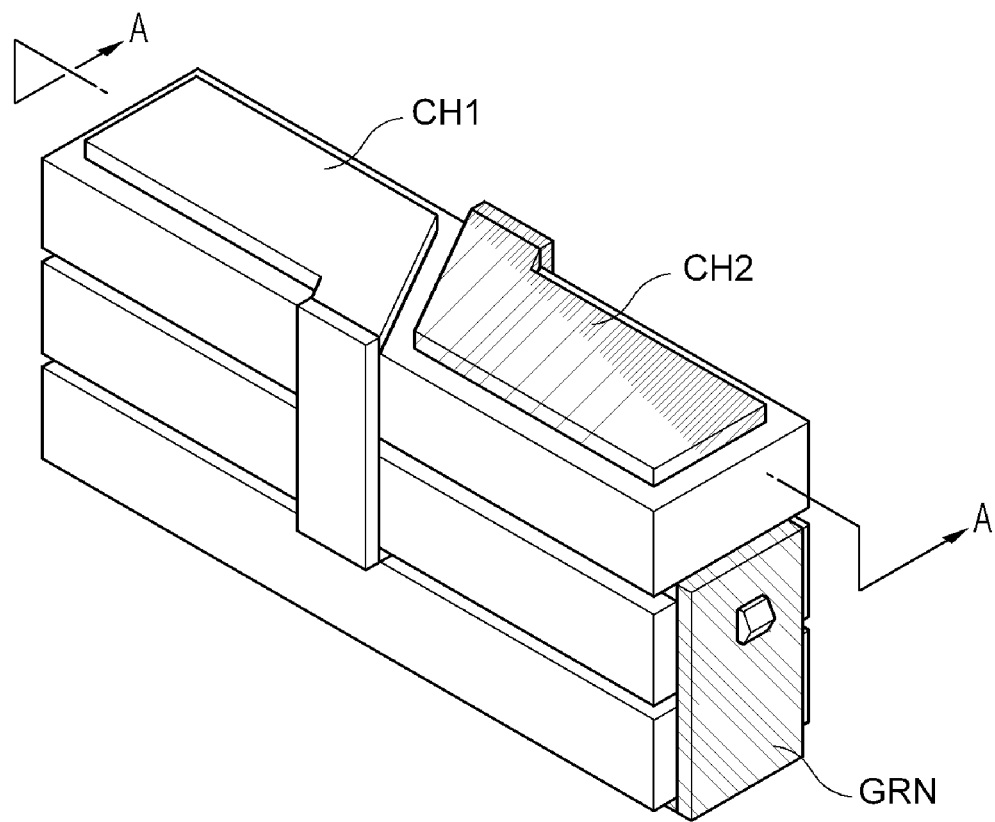
FIGS. 4A and 4B are a perspective view and a sectional view showing a polarization direction of a piezoelectric vibrator having a first channel and a second channel according to an embodiment of the present invention, respectively.
Figure 4B:
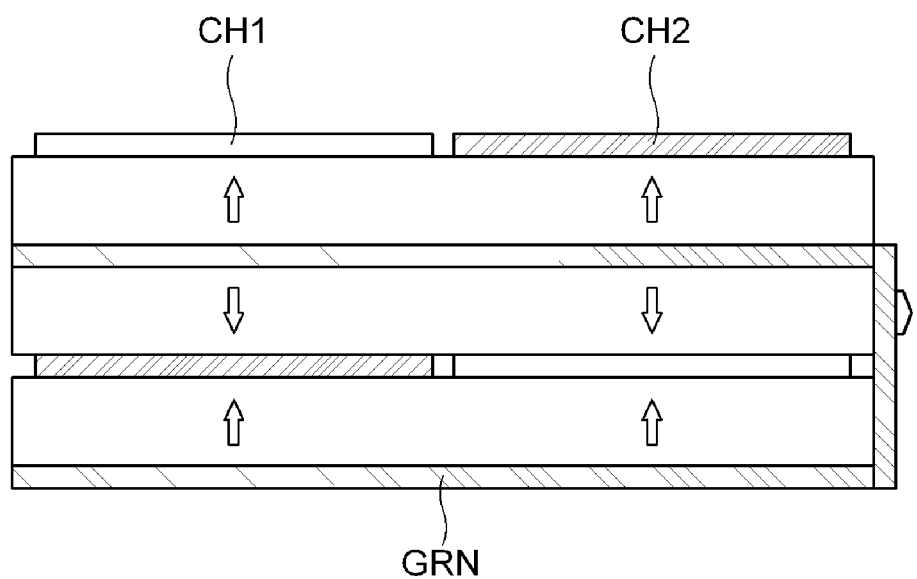

FIG. 4A is a perspective view of a piezoelectric vibrator having a first channel and a second channel for applying an AC voltage, and FIG. 4B is a sectional view taken along line A-A', showing a polarization direction of the piezoelectric vibrator shown in FIG. 4A.

Referring to FIGS. 4A and 4B, the first to third piezoelectric elements formed of the ceramic sheet are stacked to have the alternate polarization direction (indicated by arrows), so that the vibration is simultaneously generated in the left side of the first piezoelectric element layer and the right side of the third piezoelectric element layer, and the right side of the first piezoelectric element layer and the left side of the third piezoelectric element layer in response to driving signals applied from the first channel CH1 and the second channel CH2.

Figure 5A:
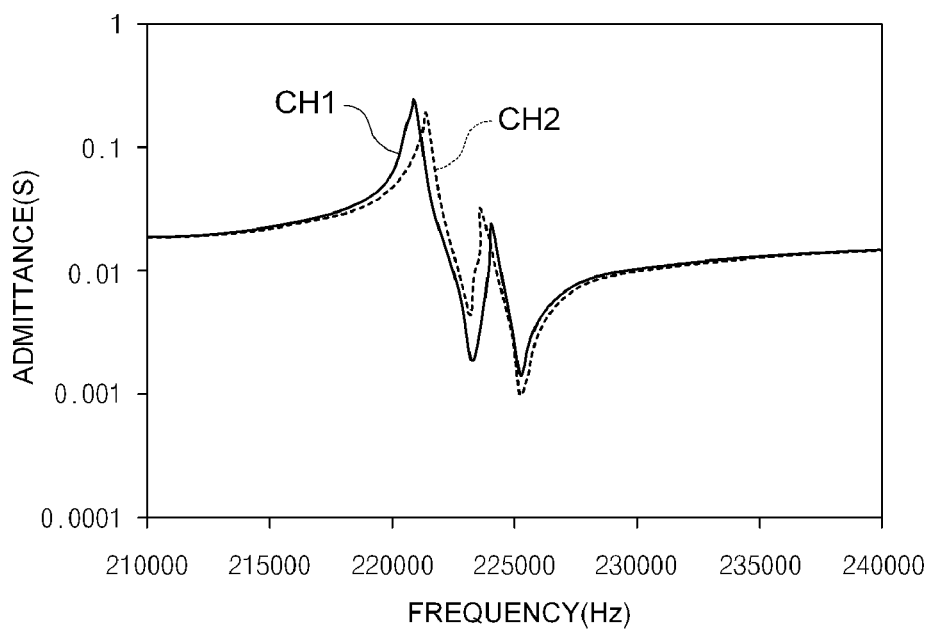
FIGS. 5A to 5C illustrates a graph of an admittance with respect to a frequency of the piezoelectric vibrator and a vibration direction in each mode of the piezoelectric vibrator according to an embodiment of the present invention, respectively.
Figure 5B:
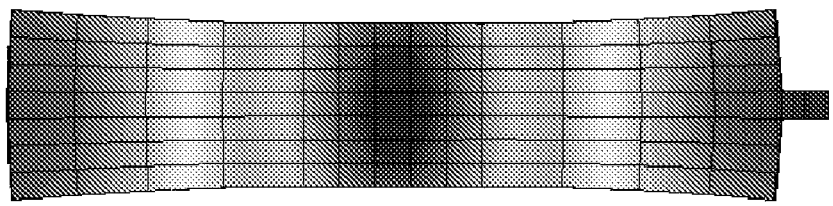

FIG. 5A is a graph illustrating a relationship between admittance and frequency when the AC voltage is applied to each channel of the piezoelectric vibrator, and FIGS. 5A and 5B illustrate vibration shapes in a longitudinal vibration mode and a flexural vibration mode of the piezoelectric vibrator when the AC voltage is applied, respectively. FIGS. 6A and 6B are sectional views illustrating an actual operation of an actuator having the piezoelectric vibrator according to the vibration modes of FIG. 5.

Figure 5C:
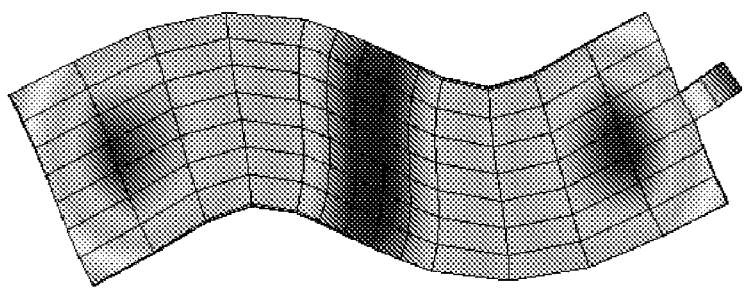
Figure 6A:
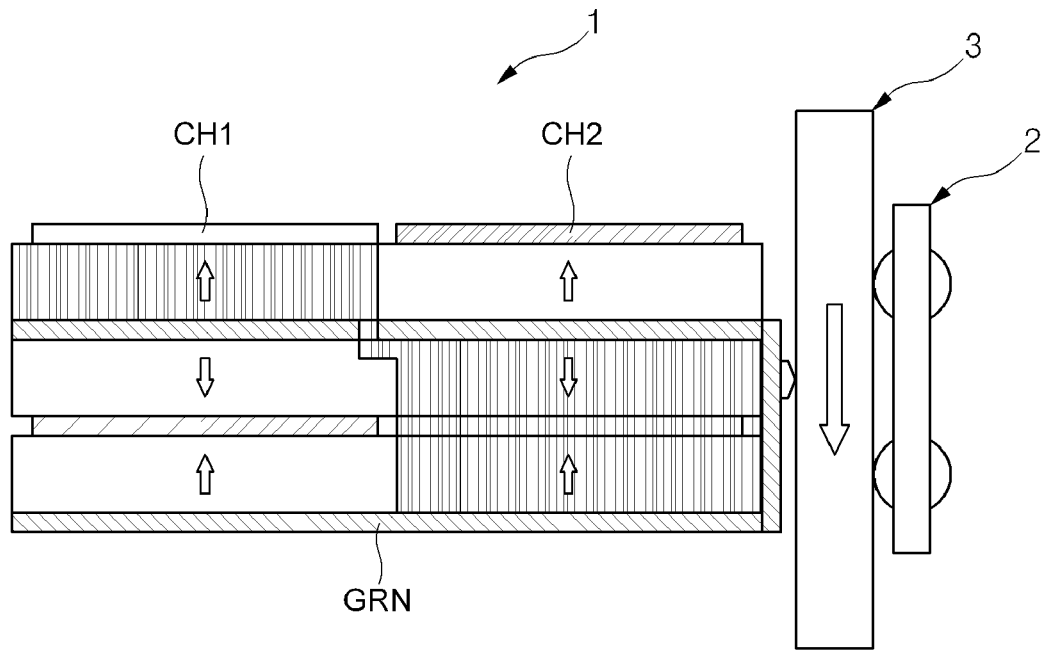
FIGS. 6A and 6B are sectional views illustrating an operation of an actuator having the piezoelectric vibrator according to an embodiment of the present invention.
Figure 6B:
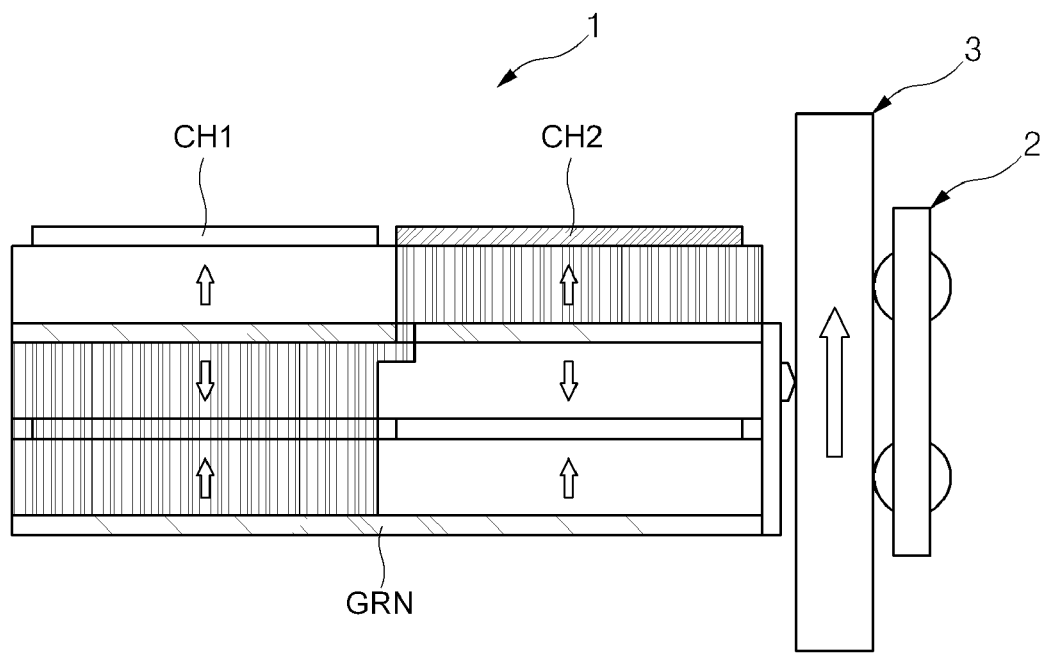

As can be seen from FIG. 5A, the longitudinal vibration mode of FIG. 5B has a peak around 222 kHz and the flexural vibration mode of FIG. 5C has a peak around 224 kHz. When the AC voltage is applied to the first channel CH1, the admittance is measured in such a state that the second channel CH2 is opened. When the AC voltage is applied to the second channel CH2, the admittance is measured in such a state that the first channel CH1 is opened. Meanwhile, the frequency at which the longitudinal vibration mode and the flexural vibration mode are generated can be changed according to the size of the piezoelectric vibrator.

Therefore, the longitudinal vibration and the flexural vibration are simultaneously generated when a resonance frequency of about 223 kHz is applied to the first channel CH1 or the second channel CH2. The resonance frequency of about 223 kHz corresponds to a middle frequency between the longitudinal vibration mode and the flexural vibration mode.

Consequently, as shown in FIG. 6A, when the AC voltage is applied to the first channel CH1 while the second channel CH2 is opened, the longitudinal strain and the flexural strain of the piezoelectric vibrator 1 are simultaneously generated by the strain generated from the vibration part (indicated by a hatched portion), resulting in a clockwise elliptical motion. Due to the clockwise elliptical motion, a conveying member 3 contacting a bearing guide 2 through the power transmission member 300 is moved downwards.

As shown in FIG. 6B, when the AC voltage is applied to the second channel CH2 while the first channel CH1 is opened, the longitudinal strain and the flexural strain of the piezoelectric vibrator 1 are simultaneously generated by the strain generated from the vibration part (indicated by a hatched portion), resulting in a counterclockwise elliptical motion. Due to the counterclockwise elliptical motion, the conveying member 3 contacting the bearing guide 2 through the power transmission member 300 is moved upwards.

Meanwhile, all the four vibration parts can be vibrated by simultaneously applying the AC voltages having a different phase to the first channel CH1 and the second channel CH2.

In this case, the phase difference between the first channel CH1 and the second channel CH2 may be 90° or −90°. The variation of the phase difference determines the moving direction of the conveying member 3.

An attachment position of the wire for applying the AC voltage to the first channel and the second channel will be described below with reference to FIGS. 5 and 7. The wire can be attached to the electrode using soldering or conductive adhesive, e.g., conductive epoxy. For convenience of explanation, the soldering method will be described for illustrative purposes.

As shown in FIGS. 5B and 5C, in the shapes of the longitudinal vibration mode and the flexural vibration mode of the piezoelectric vibrator 1 upon application of the AC voltage, the center of the piezoelectric element is a nodal point corresponding to a position where no motion occurs during the vibration. Therefore, it is preferable that a solder dot 510 is positioned at the nodal points of the top electrodes 111 and 112 and the bottom electrode 133 of the piezoelectric element 100 in order to solder the piezoelectric vibrator 1 and the wire 500 connected to an external voltage supply (not shown).

As described above, when the 0.1 μm strain occurs in the piezoelectric vibrator and the vibration frequency is 250 kHz, the acceleration influencing the solder dot is more than about 200,000 mm/s$^2$. In the case of a vibrator that is so small that the solder dot is not placed at the nodal point, the high acceleration weakens the solder strength, degrading the operation reliability of the piezoelectric vibrator.

Figure 7A:
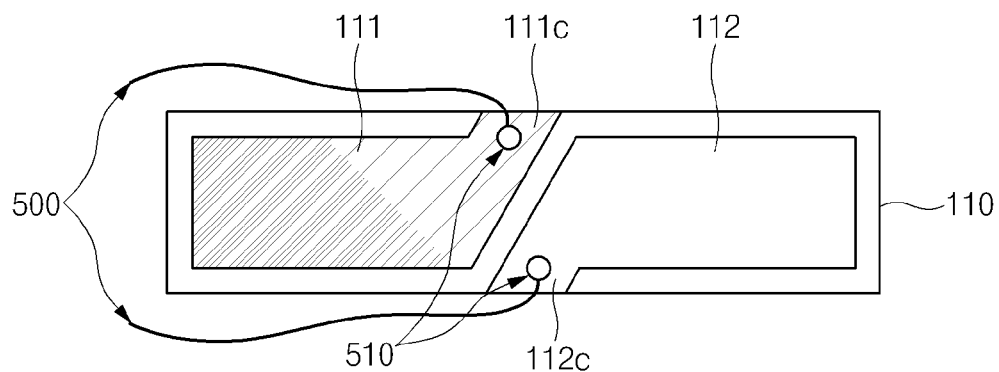
FIGS. 7A to 7C illustrates states when a wire for applying an AC voltage is connected to the piezoelectric vibrator according to an embodiment of the present invention.
Figure 7B:
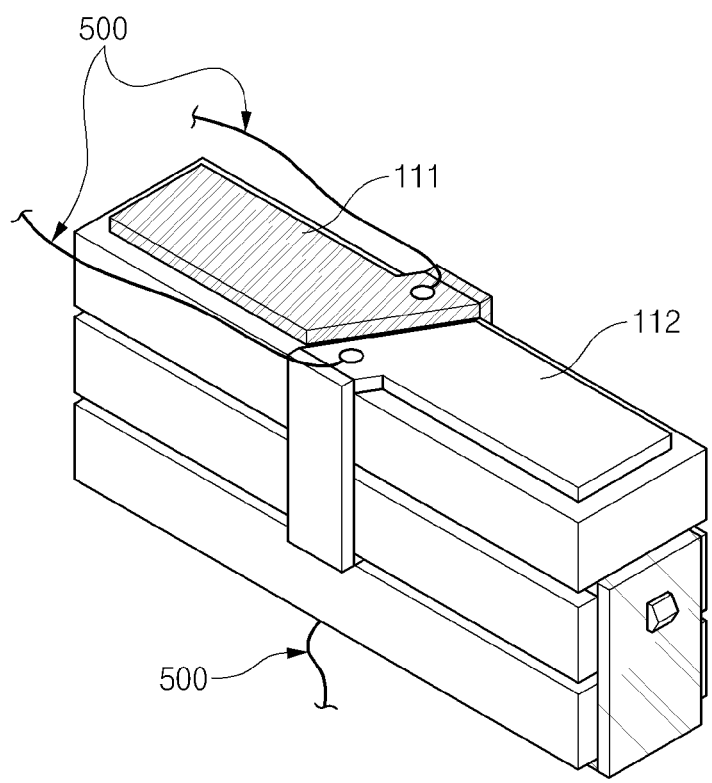
Figure 7C:
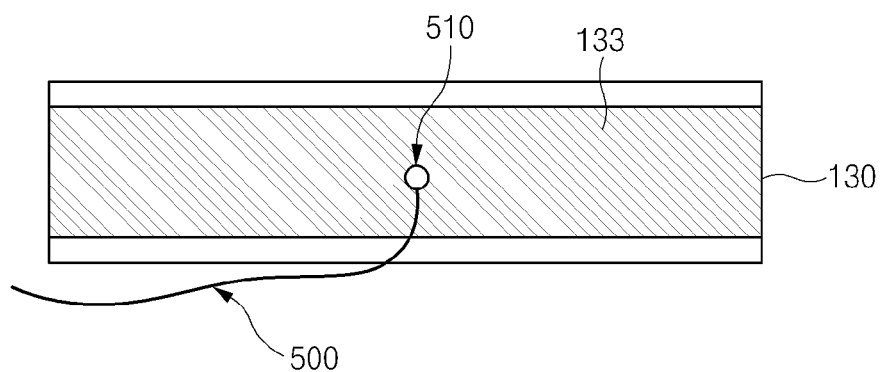

Considering this fact, it is preferable that the solder dot 510 is formed in order to apply the external AC voltage to the bent portions 111c and 112c of the top electrodes 111 and 112 of the first piezoelectric element layer 110, as shown in FIG. 7A, and the solder dot 510 is formed in the center of the bottom electrode 133 of the third piezoelectric element layer 130 such that it is connected to the ground terminal, as shown in FIG. 7C. The bent portions 111c and 112c formed in the piezoelectric vibrator 1 has a size substantially equal to the pattern width of the top electrodes 111 and 112. Since sufficient space for the soldering can be secured, the wire 500 can be attached and supported more firmly on the surface of the vibrator.

FIG. 8 illustrates a modification of the solder dot position for applying the AC voltage to the first channel and the second channel.

Figure 8A:
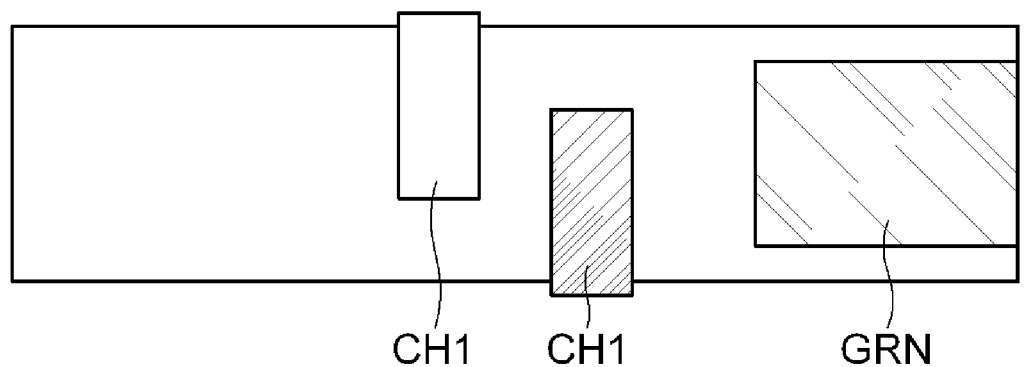
FIGS. 8A and 8B are bottom views of a modification of the piezoelectric vibrator at a solder dot position for apply an AC voltage to a first channel and a second channel.

As shown in FIG. 8A, the side electrodes 200 corresponding to the first channel and the second channel are not contacted with the bottom electrode 133 and extend inside the bottom surface of the piezoelectric element where the bottom electrode 133 connected to the ground is formed. That is, the first channel, the second channel, and the ground electrode are all disposed on the bottom surface of the piezoelectric element, so that all of them can be wired on a single plane.

Figure 8B:
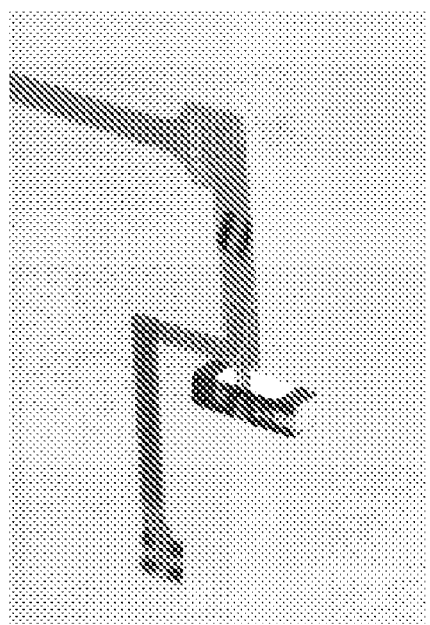

As shown in FIG. 8B, instead of the wire, an FPCB can be used to apply the external AC voltage. Therefore, in terms of the real product application, it is more preferable that a power connection part (i.e., a connection of the FPCB and the solder dot formed on the bottom surface of the piezoelectric element) is provided by placing three electrodes on one plane (the bottom surface of the piezoelectric element).

Hereinafter, embodiments of the present invention will be described in detail.

Embodiment 1

Figure 9:
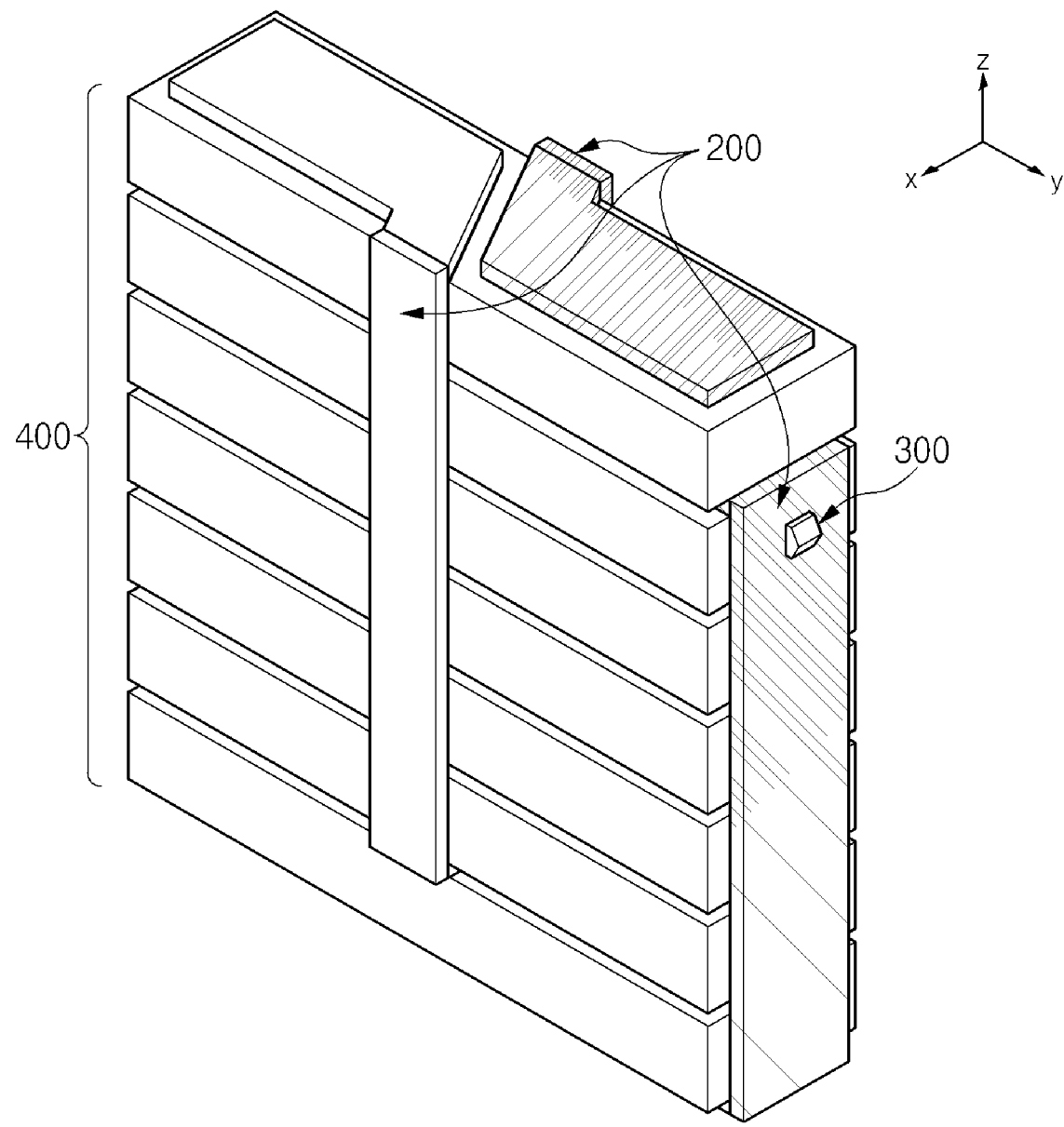
FIG. 9 is a perspective view of a piezoelectric vibrator according to a first embodiment of the present invention.
Figure 10:
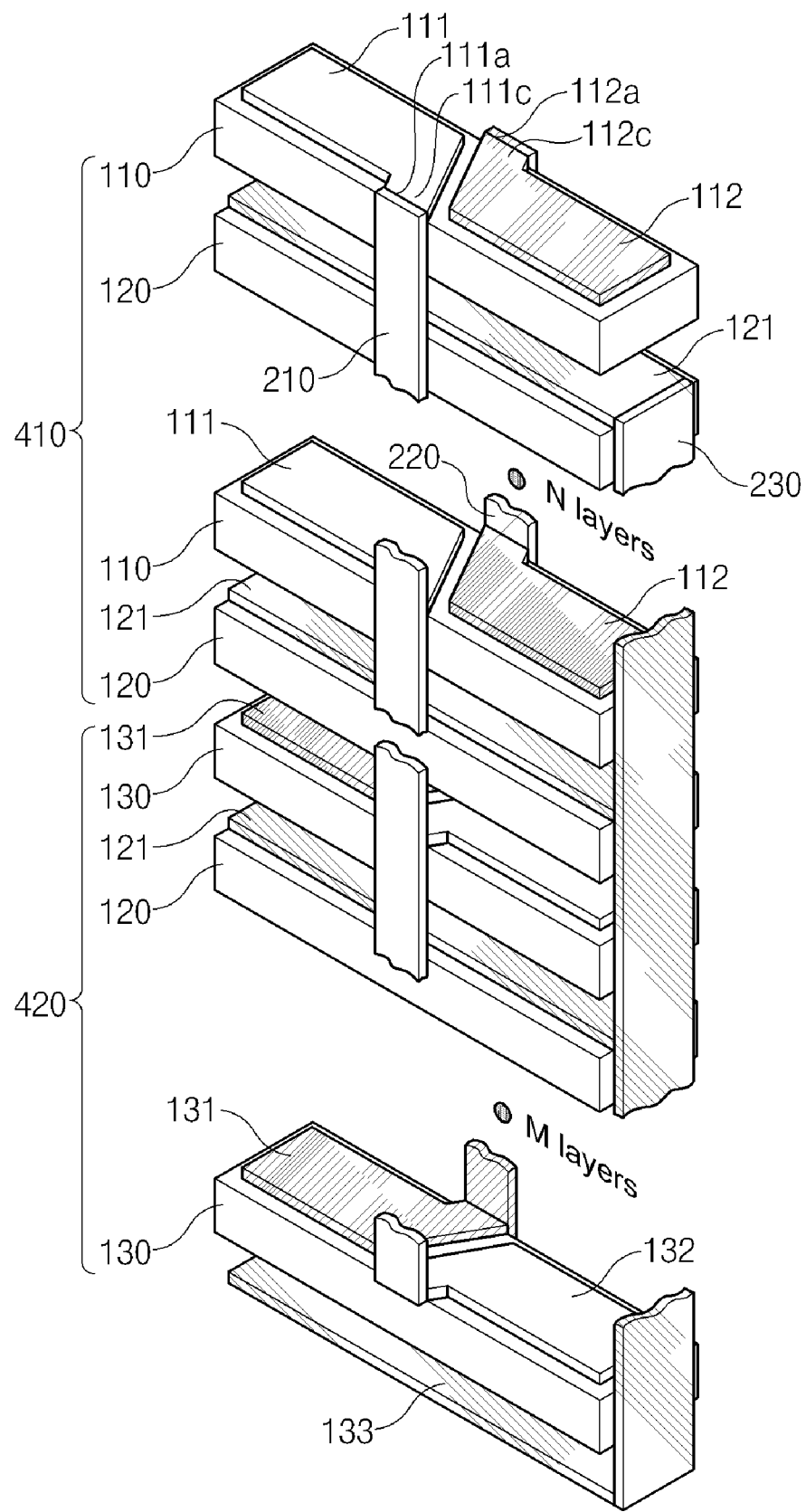
FIG. 10 is an exploded perspective view of the piezoelectric vibrator shown in FIG. 9.

FIG. 9 is a perspective view of a piezoelectric vibrator according to a first embodiment of the present invention, and FIG. 10 is an exploded perspective view of the piezoelectric vibrator shown in FIG. 9.

The piezoelectric vibrator includes a piezoelectric element having four vibration parts, an internal electrode pattern, an external electrode pattern, and a power transmission member.

As shown in FIGS. 9 and 10, the piezoelectric element 400 includes an N-layer stacked structure 410 and an M-layer stacked structure 420. The N-layer stacked structure 410 is provide by alternately stacking a first piezoelectric element layer 110 and a second piezoelectric element layer 120. The M-layer stacked structure 420 is provided under the N-layer stacked structure 410 by alternately stacking a third piezoelectric element layer 130 and the second piezoelectric element layer 120.

Top electrodes 111 and 112 divided by two regions are formed on the first piezoelectric element layer 110 disposed at the uppermost of the N-layer stacked structure 410, thereby forming two vibration parts. The top electrodes 111 and 112 are external electrode patterns exposed to the outside and are soldered with a wire 500 for applying an AC voltage from a power source.

An internal ground electrode 121 is formed in the second piezoelectric element layer 120 that is downwardly adjacent to the uppermost piezoelectric element layer 110 of the N-layer stacked structure 410. The internal ground electrode 121 will be referred to as N-layer internal ground electrode.

An internal electrode is formed in the piezoelectric element layer that is downwardly adjacent to the piezoelectric element layer where the internal ground electrode 121 is formed. The internal electrode has the same shape and arrangement as the pattern of the top electrodes 111 and 112. The internal electrode will be referred to as an N-layer internal electrode and is indicated by the same reference numerals 111 and 112 as the top electrodes. A piezoelectric element layer is formed, in which the ground electrode having the same shape and arrangement as the internal ground electrode 121 formed in the second piezoelectric element layer 120 is formed. This alternate stack constitutes the N-layer stacked structure 410 having first to N-th piezoelectric element layers (N is even numbers that are equal to or greater than 4).

Likewise, the internal electrodes 131 and 132 are formed in the piezoelectric element layer that is downwardly adjacent to the lowermost piezoelectric element layer of the N-layer stacked structure 410. The internal electrodes 131 and 132 are formed in the patterns symmetrical with the internal electrode patterns of the N-layer stacked structure 410 with respect to the stack plane (xy plane). The internal electrodes 131 and 132 will be referred to as M-layer internal electrodes.

A piezoelectric element layer where a ground electrode (hereinafter, referred to as an M-layer internal ground electrode) having the same shape and arrangement as the N-layer internal ground electrode 121 is formed is stacked under the M-layer internal electrodes. This alternate stack constitutes the M-layer stacked structure 420 having first to M-th piezoelectric element layers (M is odd numbers that are equal to or greater than 3). The lowermost piezoelectric element layer of the M-layer stacked structure 420 corresponds to the piezoelectric element layer where the M-layer internal electrodes 131 and 132, and the bottom electrode 133 is formed on the bottom surface of the piezoelectric element layer.

The bottom electrode 133 has the same shape and arrangement as the M-layer and N-layer internal ground electrodes 122. The bottom electrode 133 is an external electrode pattern exposed to the outside and is soldered with the external ground terminal through the wire 500.

The N-layer stacked structure 410 of the piezoelectric element 400 is disposed on the M-layer stacked structure 420 and includes two vibration parts divided into the left and right sides. The M-layer stacked structure 420 includes two vibration parts divided into the left and right sides.

The pattern combination of the internal electrode, the internal ground electrode, the top electrode, and the bottom electrode according to the present invention will be described below in detail.

The top electrode, the N-layer internal electrodes 111 and 112, and the M-layer internal electrodes 131 and 132 having the shape symmetrical with the N-layer internal electrodes 111 and 112 have the bent patterns 111c, 112c, 131c and 132c such that one ends 111a, 112b, 131a and 132a adjacent to one another among the bisected patterns on the piezoelectric element layers extend up to the outside of the piezoelectric element in an opposite direction from the center of the piezoelectric element.

In addition, portions of the N-layer and M-layer internal ground electrodes 121 and the bottom electrode 133 extend up to the edge of the piezoelectric elements. Therefore, the side element 200 commonly connecting the internal ground elements 121 and the bottom electrode 133 are formed in the end side of the piezoelectric element 400. In this case, the top electrode, the N-layer internal electrodes 111 and 112, and the M-layer internal electrodes 131 and 132 must be formed on the piezoelectric element such that they are not electrically connected to the side electrode 200 and do not extend up to the end of the piezoelectric element.

Hereinafter, a method for manufacturing the piezoelectric vibrator 1 according to the first embodiment of the present invention with reference to the accompanying drawings.

Figure 11A:
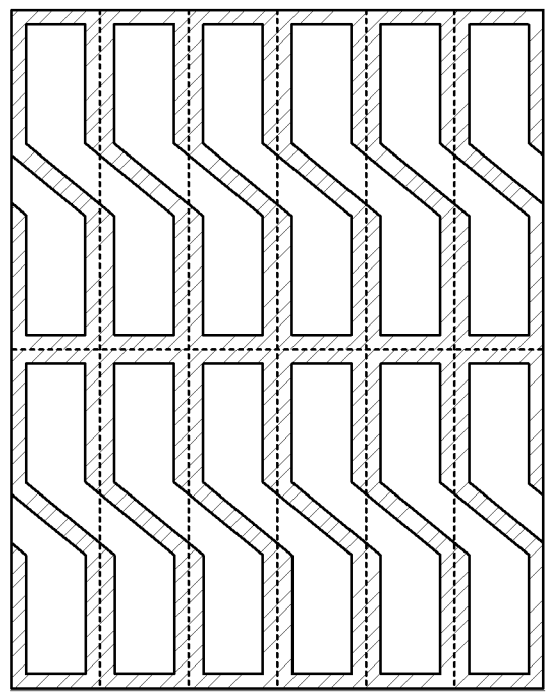
FIGS. 11A to 11C are plan views of piezoelectric sheets used in manufacturing a piezoelectric vibrator according to the first embodiment of the present invention.
Figure 11B:
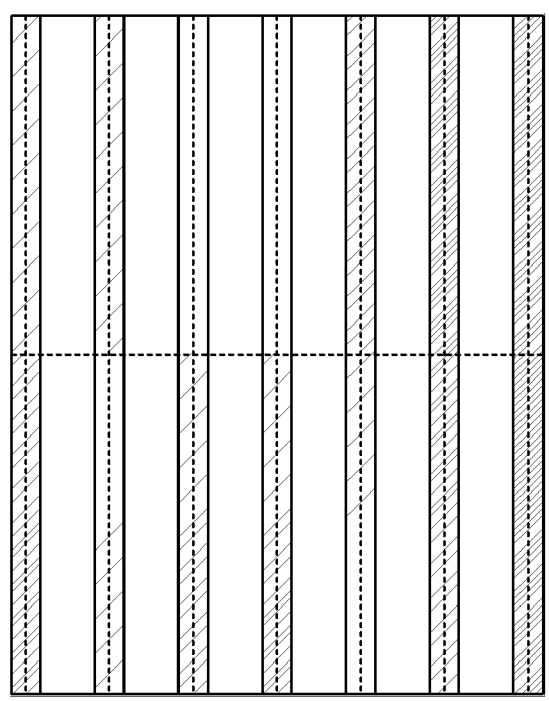
Figure 11C:
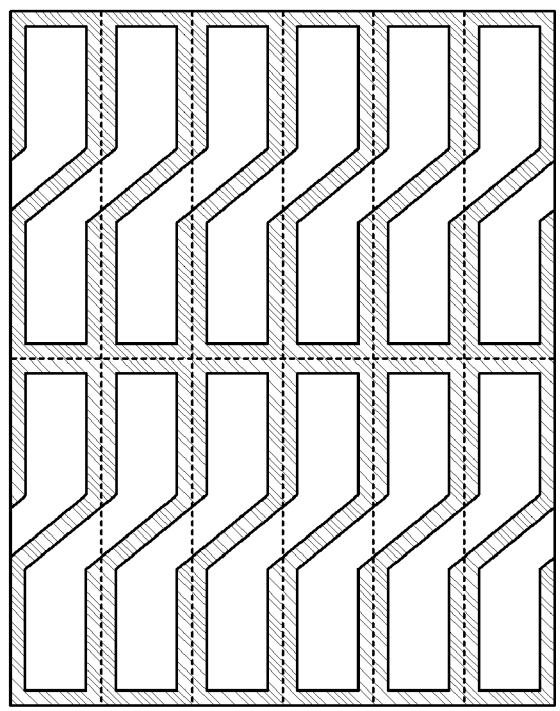

FIG. 11 is a plan view of a piezoelectric sheet used in manufacturing a piezoelectric vibrator 1 according to the first embodiment of the present invention. Specifically, FIG. 11A is a plan view of a piezoelectric sheet where a top electrode pattern and an N-layer internal electrode pattern are formed, and FIG. 11B is a plan view of a piezoelectric sheet where the N-layer and M-layer internal ground electrode patterns and the bottom electrode pattern are formed, and FIG. 11C is a plan view of a piezoelectric sheet where an M-layer internal electrode pattern is formed.

Referring to FIG. 11, the electrode patterns can be formed using screen printing in order to manufacturing a piezoelectric vibrator 1 having a 6×2 array. In addition, the electrode patterns can be formed using known methods, e.g., tape casting. The pattern formed in the piezoelectric sheet 630 of FIG. 11C is symmetrical with the pattern formed in the piezoelectric sheet 610 of FIG. 11A.

An N-layer stacked structure is formed by repetitively stacking the piezoelectric sheet for the internal ground electrode and the piezoelectric sheet for the internal electrode until a total number of the stacked piezoelectric sheets becomes N in the following order: the first piezoelectric sheet (the piezoelectric sheet 610 of FIG. 11A) for the top electrode, the second piezoelectric sheet (the piezoelectric sheet 620 of FIG. 11B) for the internal ground electrode, the first piezoelectric sheet (the piezoelectric sheet 610 of FIG. 11A) for the internal electrode, the second piezoelectric sheet 620 for the internal ground electrode, the first piezoelectric sheet 610 for the internal electrode, etc.

Then, an M-layer stacked structure is formed by repetitively stacking the piezoelectric sheet for the internal ground electrode and the piezoelectric sheet for the internal electrode until a total number of the stacked piezoelectric sheets becomes M in the following order: the third piezoelectric sheet (the piezoelectric sheet 630 of FIG. 11C) for the internal electrode, the second piezoelectric . . . under the piezoelectric sheet 620 for the internal ground electrode disposed at the lowermost of the N-layer stacked structure 410. The piezoelectric sheet 630 shown in FIG. 11C is disposed at the lowermost of the M-layer stacked structure.

Figure 12A:
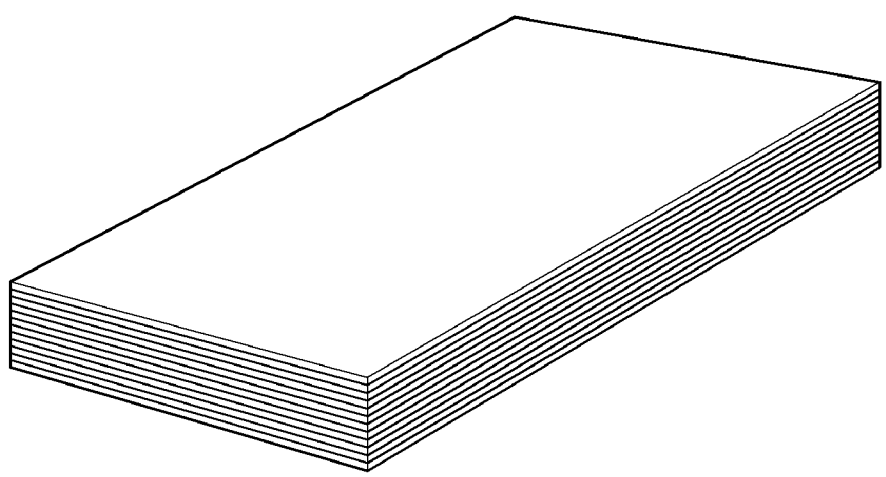
FIGS. 12A to 12E are sectional views illustrating a method for manufacturing the piezoelectric vibrator according to the first embodiment of the present invention.

The piezoelectric sheet stacked structure 600 of FIG. 12A is formed through these stacking processes.

Figure 12B:
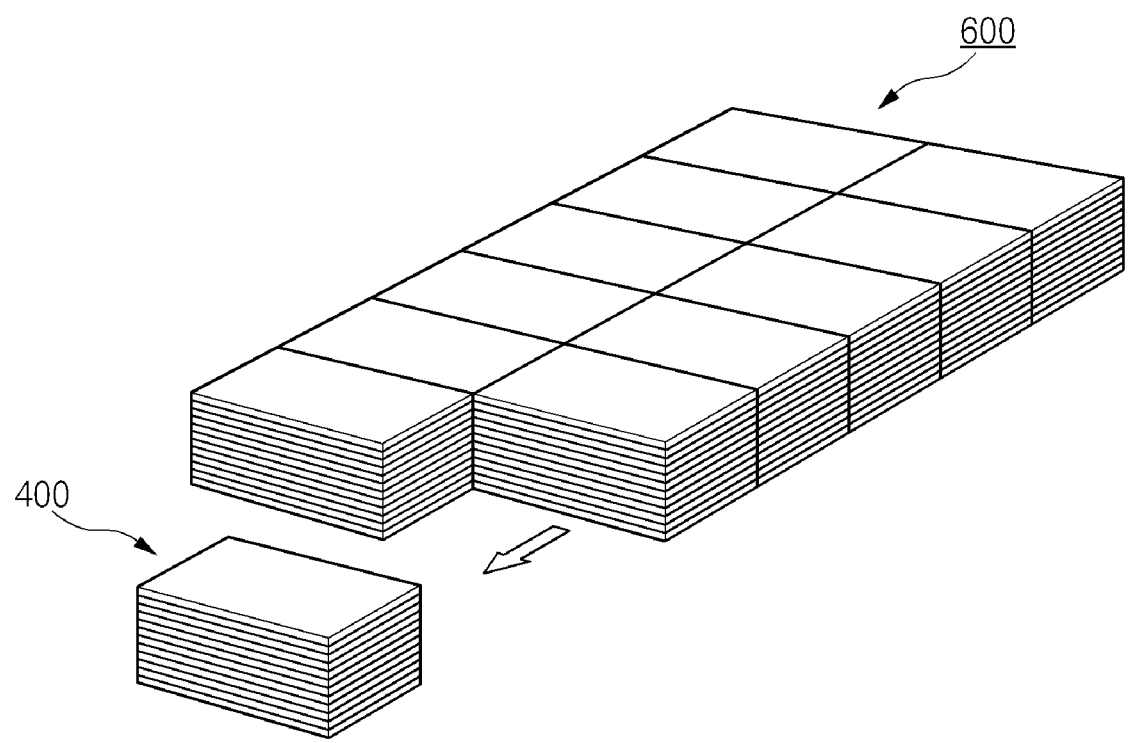

As shown in FIG. 12B, the piezoelectric sheet stacked structure 600 is cut along a cutting line to form unit piezoelectric elements 400 of 6×2 array.

Figure 12C:
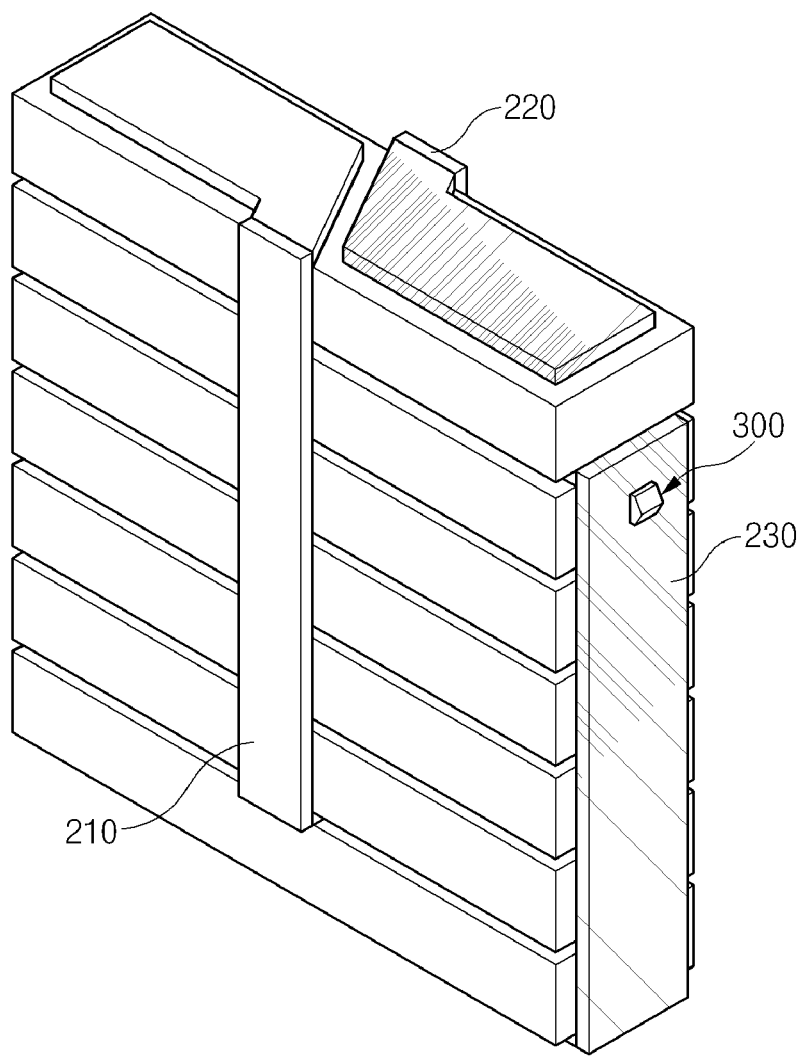

As shown in FIG. 12C, the first and second side electrodes 210 and 220 are attached to both sides of the unit piezoelectric element 400, and the third side electrode 230 is attached to the end side of the unit piezoelectric element 400.

The first side electrode 210 is used to simultaneously apply the AC voltage to the left pattern serving as the left vibration part of the N-layer stacked structure 410 and the right pattern serving as the right vibration part of the M-layer stacked structure 420. In addition, the second side electrode 220 formed on a surface opposite to the side where the first side electrode 210 is formed is used to simultaneously apply the AC voltage to the right pattern serving as the right vibration part of the N-layer stacked structure 410 and the left pattern serving as the left vibration part of the M-layer stacked structure 420.

The power transmission member 300 is attached to the third side electrode 230. The power transmission member 300 has a protrusion shape and transfers a driving force generated from the piezoelectric element 400 to the outside.

Figure 12D:
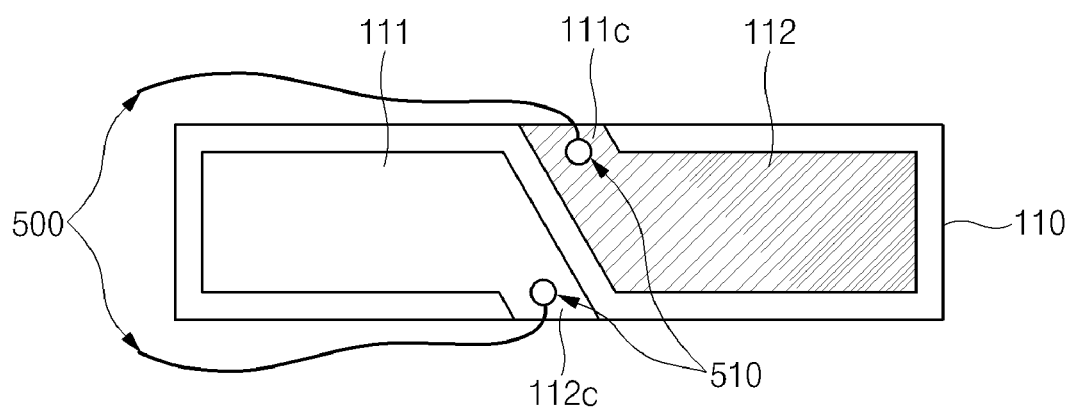
Figure 12E:
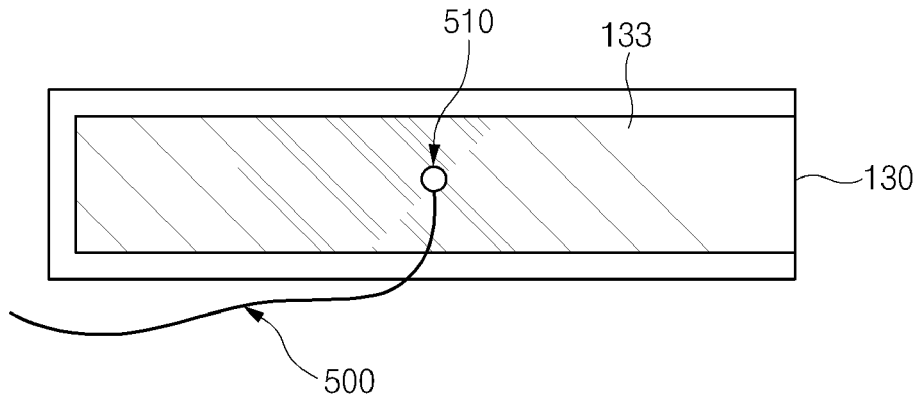

As shown in FIGS. 12D and 12E, the wire 500 is soldered with the top electrodes 111 and 112 and the bottom electrode 133 of the M-layer stacked structure 420 so as to apply an electric signal from an external power source to the piezoelectric vibrator 1.

As described above, it is preferable that the solder dots 510 are formed at the bent portions 111c and 112c of the top electrodes as shown in FIG. 12D, and the solder dot 510 is formed at the center of the bottom electrode 133 as shown in FIG. 12E.

Embodiment 2

Figure 13:
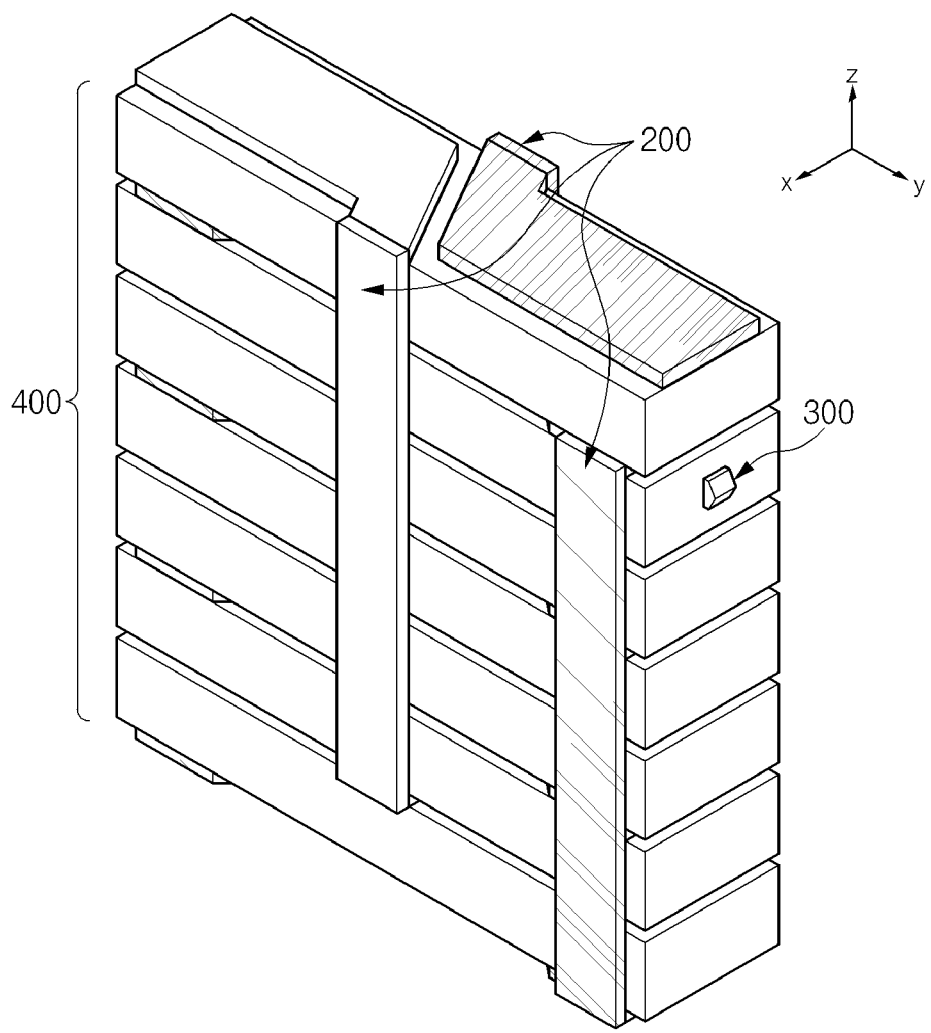
FIG. 13 is a perspective view of a piezoelectric vibrator according to a second embodiment of the present invention.
Figure 14:
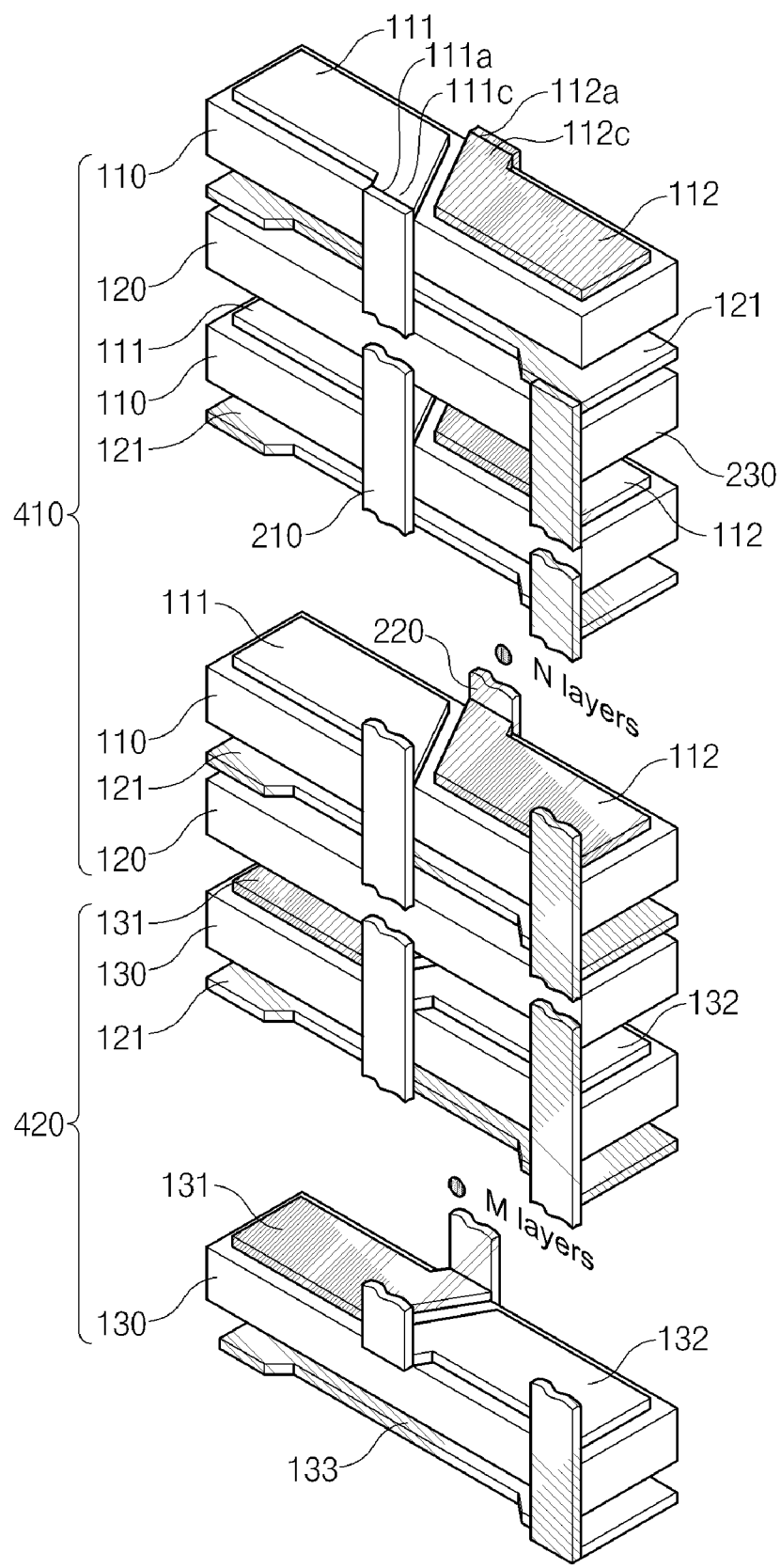
FIG. 14 is an exploded perspective view of the piezoelectric vibrator shown in FIG. 13.

FIG. 13 is a perspective view of a piezoelectric vibrator according to a second embodiment of the present invention, and FIG. 14 is an exploded perspective view of the sheet (the piezoelectric sheet 620 of FIG. 11B) for the internal ground electrode, the third piezoelectric sheet 630 for the internal electrode, the second piezoelectric sheet 620 for the internal ground electrode, piezoelectric vibrator shown in FIG. 13.

Since the piezoelectric vibrator of FIG. 13 is almost similar to the piezoelectric vibrator according to the first embodiment of the present invention, the following description will be focused on different components.

Unlike the first embodiment, portions of the internal ground electrode 121 and the bottom electrode 133 extend up to the outside of both sides of the piezoelectric element. Therefore, the third side electrode 230 electrically connecting the N-layer and M-layer internal ground electrodes 121 and the bottom electrode 133 is formed on the same side as the plane where the first or second side electrode 210 and 220 is formed which commonly connects the top electrode 111 and the internal electrode 112 of the N-layer stacked structure 410 and the internal electrodes 131 and 132 of the M-layer stacked structure 420 disposed in a diagonal direction of the N-layer internal electrode.

Meanwhile, in this case, the patterns of the top electrode 111 and/or the internal electrode 112 may extend up to the edge of the piezoelectric element.

Figure 15A:
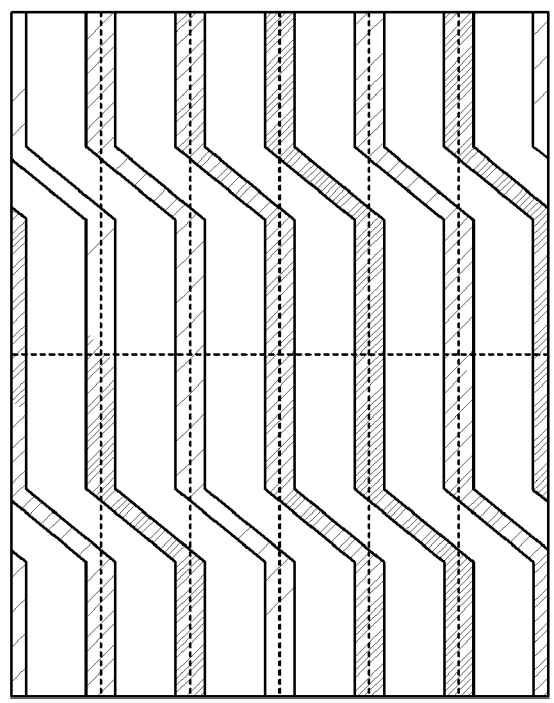
FIGS. 15A to 15C are plan views of piezoelectric sheets used in manufacturing a piezoelectric vibrator according to the second embodiment of the present invention.
Figure 15B:
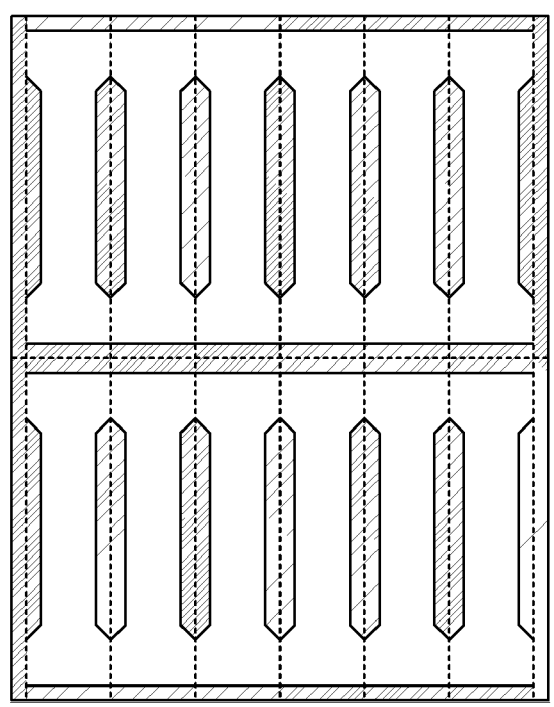
Figure 15C:
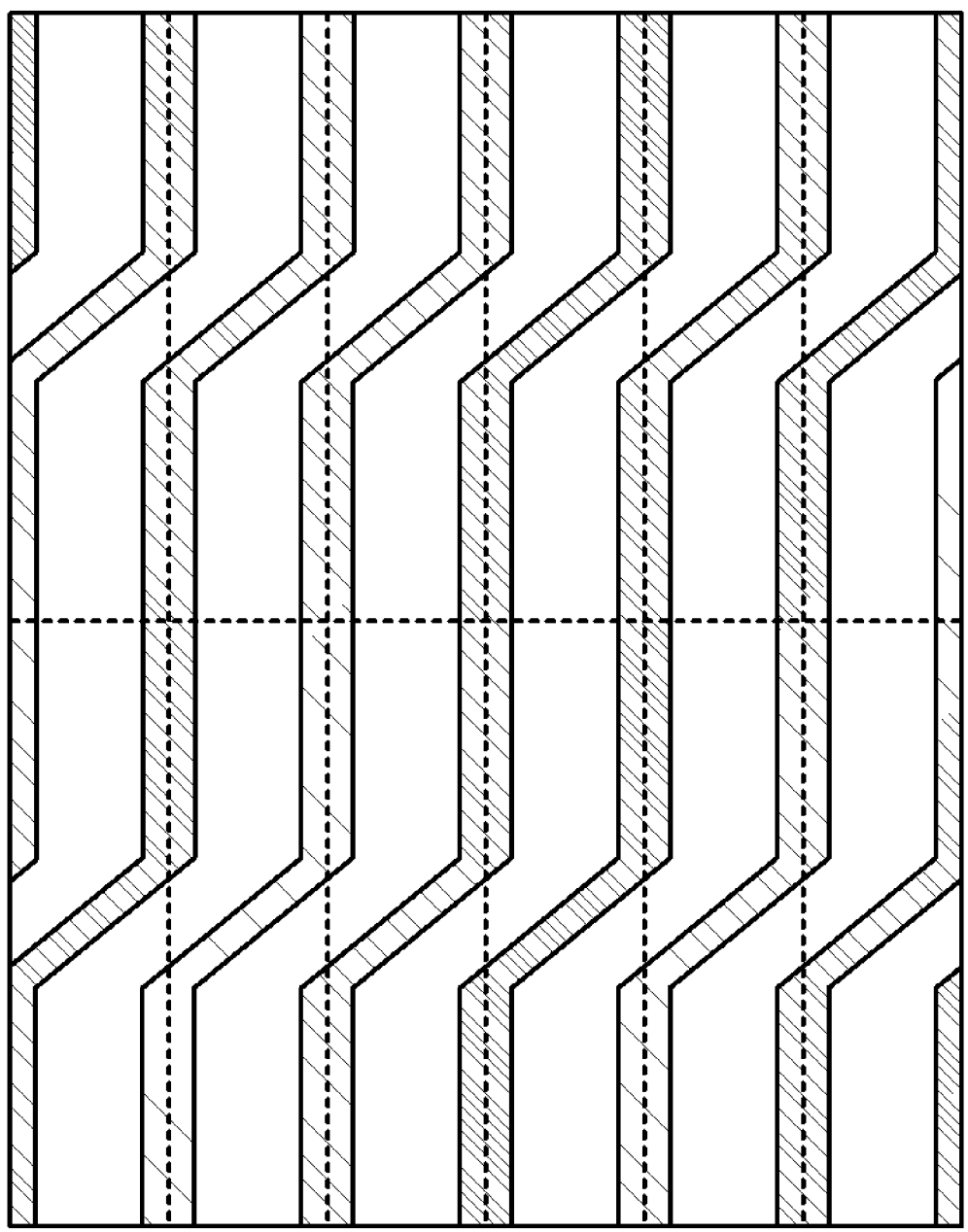

FIG. 15 is a plan view of the piezoelectric sheet used in manufacturing a piezoelectric vibrator according to the second embodiment of the present invention. Specifically, FIG. 15A is a plan view of the piezoelectric sheet where the top electrode pattern and the N-layer internal electrode pattern are formed, FIG. 15B is a plan view of the piezoelectric sheet where the N-layer and M-layer internal ground electrode patterns and the bottom electrode pattern are formed, and FIG. 15C is a plan view of the piezoelectric sheet where the M-layer internal electrode pattern is formed.

Since the processing and methods of, e.g., stacking a plurality of piezoelectric sheets, separating them into unit piezoelectric elements, and soldering them for the connection to the external power source are identical to those of the first embodiment, their detailed description will be omitted for conciseness.

Embodiment 3

Figure 16:
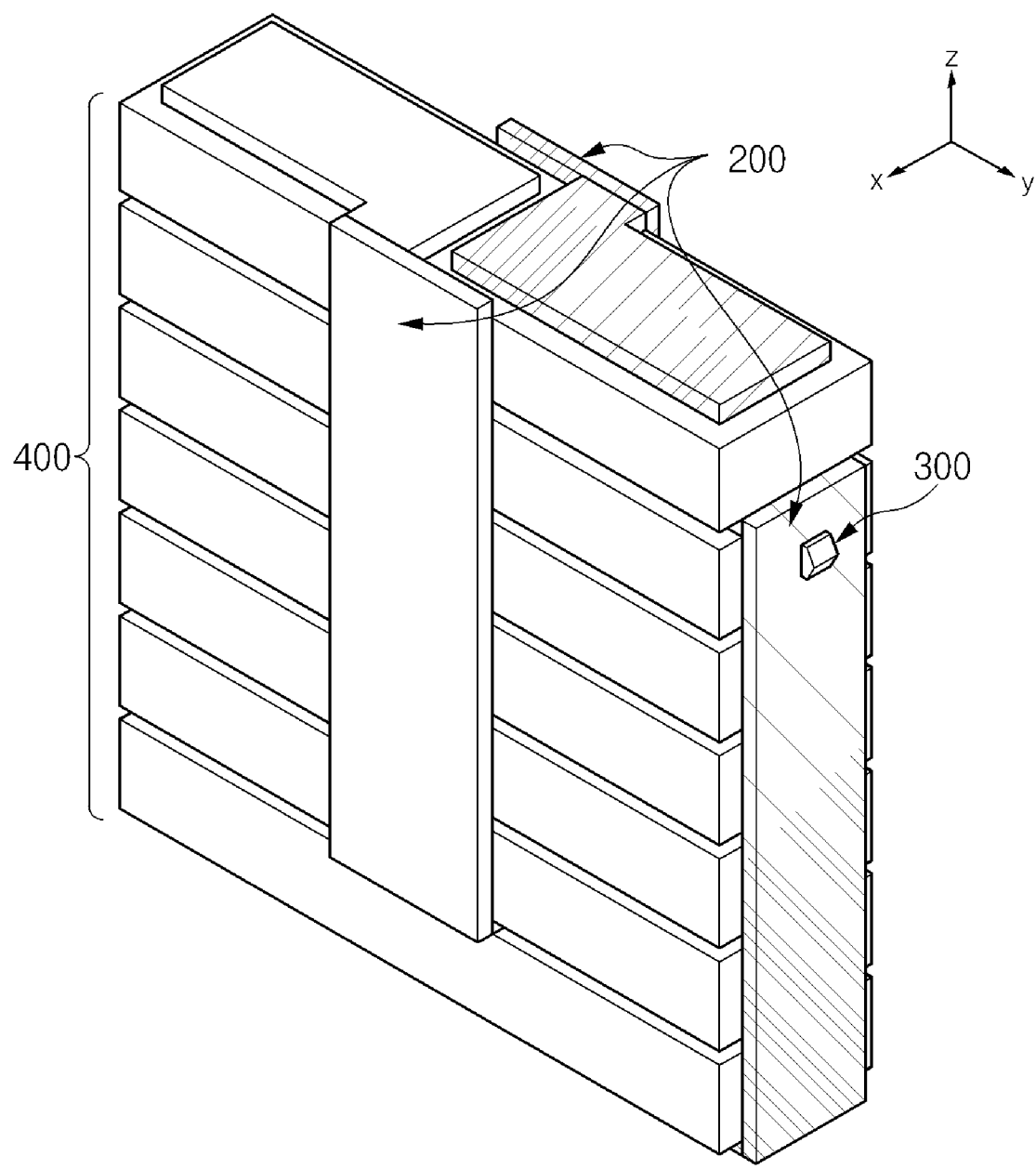
FIG. 16 is a perspective view of a piezoelectric vibrator according to a third embodiment of the present invention.
Figure 17:
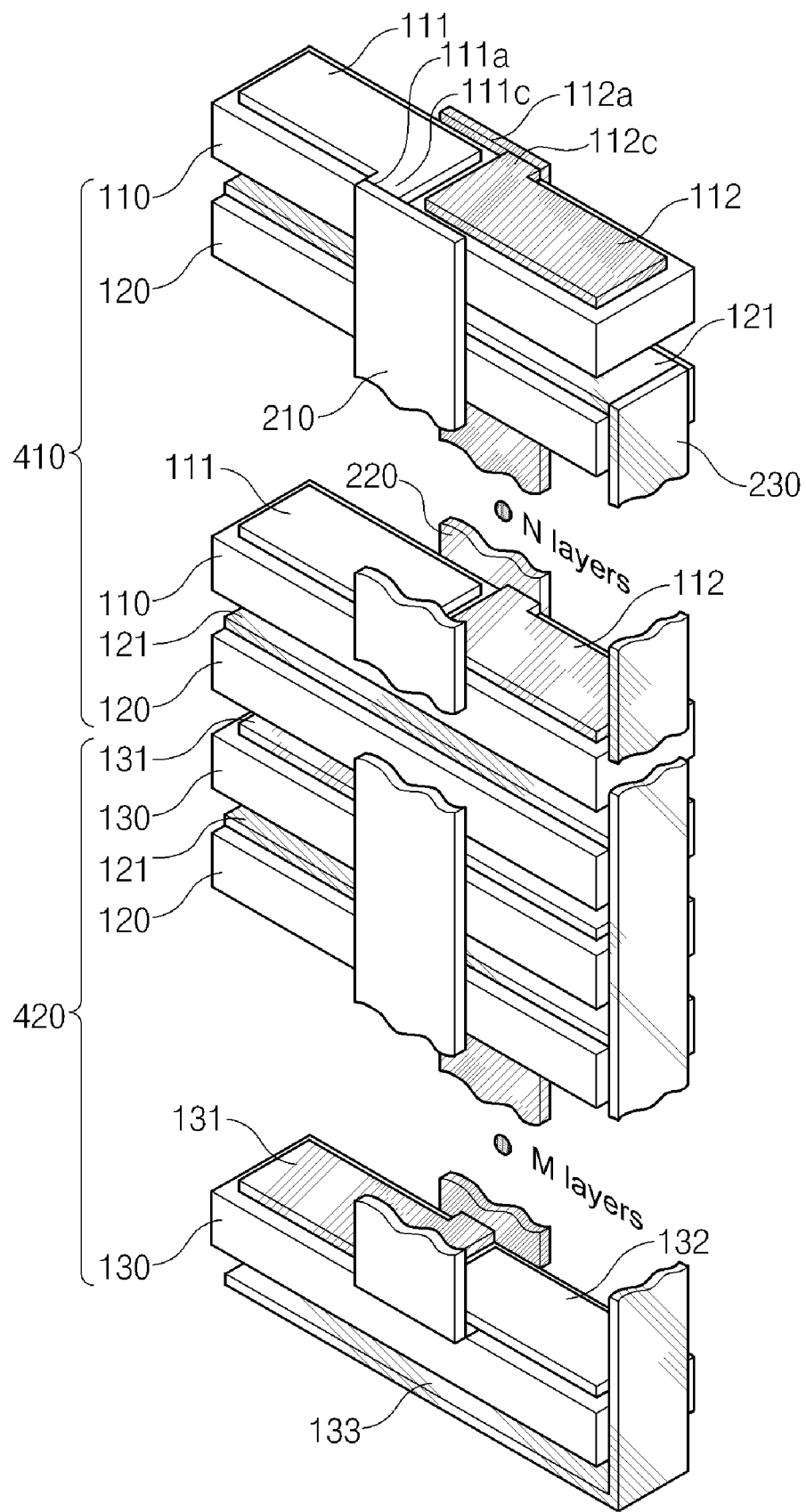
FIG. 17 is an exploded perspective view of the piezoelectric vibrator shown in FIG. 16.

FIG. 16 is a perspective view of a piezoelectric vibrator according to a third embodiment of the present invention, and FIG. 17 is an exploded perspective view of the piezoelectric vibrator shown in FIG. 16.

Since the piezoelectric vibrator of FIG. 16 is almost similar to the piezoelectric vibrator according to the first embodiment of the present invention, the following description will be focused on different components, including the bent portions of the electrodes.

Top electrode and internal electrodes 111 and 112 formed in an N-layer stacked structure 410 and M-layer internal electrodes 131 and 132 having a shape symmetrical with them have bent patterns 111c, 112c, 131c and 132c such that one ends 111a and 112a adjacent to one another among the bisected patterns extend up to the edge of the piezoelectric element in an opposite direction from the center of the piezoelectric element.

Unlike the first embodiment, the bent patterns of the top electrode 111 and the internal electrode 112 form a right angle as shown in FIGS. 16 and 17.

Figure 18A:
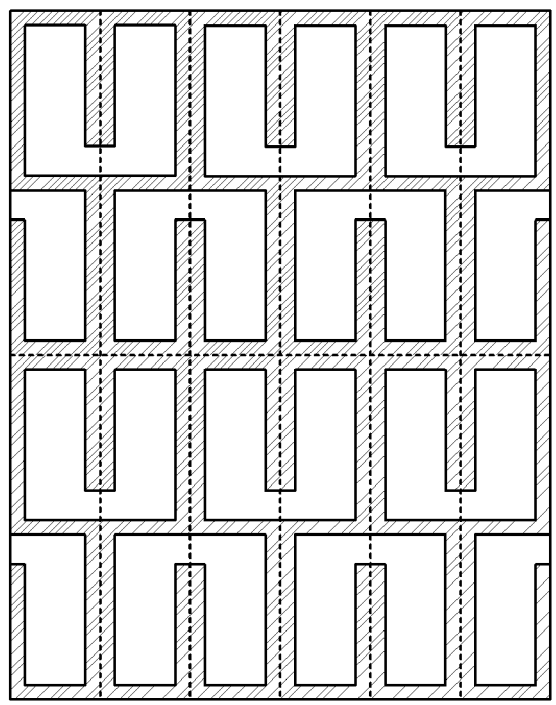
FIGS. 18A to 18C are plan views of piezoelectric sheets used in manufacturing a piezoelectric vibrator according to the third embodiment of the present invention.
Figure 18B:
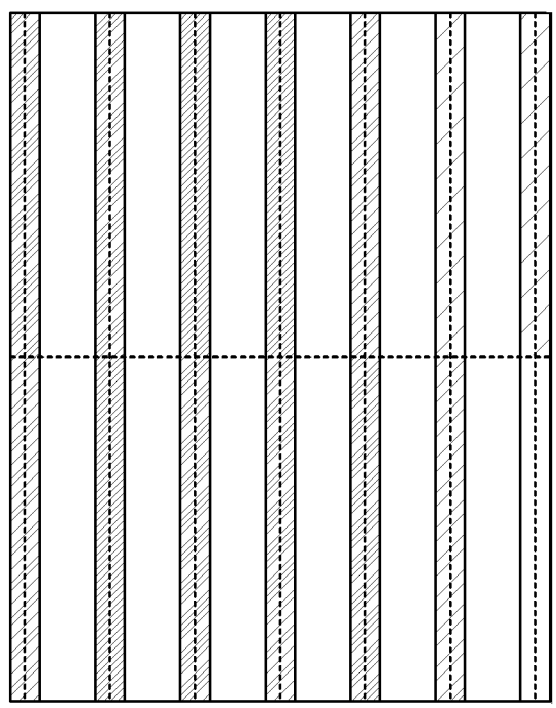
Figure 18C:
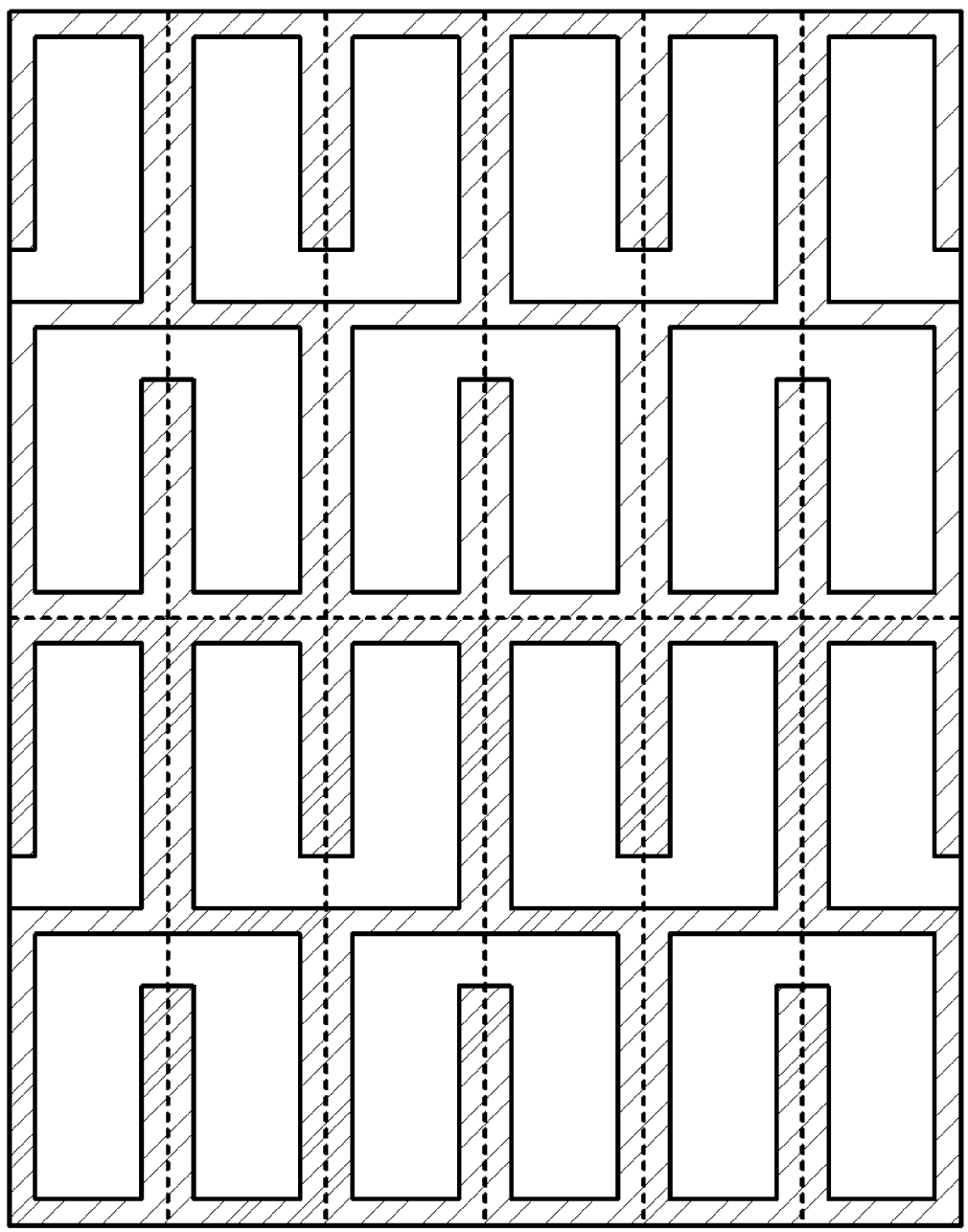

FIG. 18 is a plan view of a piezoelectric sheet used in manufacturing a piezoelectric vibrator according to the third embodiment of the present invention. Specifically, FIG. 18A is a plan view of the piezoelectric sheet where the top electrode pattern and the N-layer internal electrode pattern are formed, FIG. 18B is a plan view of the piezoelectric sheet where the N-layer and M-layer internal ground electrode patterns and the bottom electrode pattern are formed, and FIG. 18C is a plan view of the piezoelectric sheet where the M-layer internal electrode pattern is formed.

Since the processing and methods of, e.g., stacking a plurality of piezoelectric sheets, separating them into unit piezoelectric elements, and soldering them for the connection to the external power source are identical to those of the first embodiment, their detailed description will be omitted for conciseness.

Although FIGS. 16 to 18 exemplarily show the cases where the patterns bent at a right angle are applied to the first embodiment, it is apparent that they can also be applied to the second embodiment in the same way.

As described above, the present invention provides the piezoelectric vibrator that can provide high efficiency and be small-sized at low cost by adopting a simplified structure without additional conductive films.

In addition, the piezoelectric vibrator can respond to various vibration frequency variations for mass production by soldering the wire in order to apply the AC voltage to the nodal point of the piezoelectric vibrator and further improve the reliability of the piezoelectric vibrator. Further, the piezoelectric vibrator can prevent the solder strength from being weakened even in the vibration of the piezoelectric vibrator by soldering the wire to the nodal point corresponding to the bent portion formed at a relative large width.

Moreover, according to the method for manufacturing the piezoelectric vibrator, the high-reliability piezoelectric vibrator can be manufactured at low cost and can be mass-produced.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A piezoelectric vibrator comprising:
   a piezoelectric element including:
   a first piezoelectric element layer having a bisected top electrode formed thereon;
   a second piezoelectric element provided under the first piezoelectric element layer and having an internal ground electrode formed thereon; and
   a third piezoelectric element provided under the second piezoelectric element layer, the third piezoelectric element having an internal bisected electrode symmetrical with the top electrode with respect to a stack plane, and a bottom electrode formed in a plane opposite to the plane where the internal electrode is formed;
   a side electrode including:
   first and second side electrodes for electrically connecting electrode patterns formed in a diagonal direction among the electrode patterns formed in the first and third piezoelectric element layers of the piezoelectric element; and
   a third side electrode for electrically connecting the internal ground electrode of the second piezoelectric element layer to the bottom electrode of the third piezoelectric element layer; and
   a power transmission member formed in one side of the piezoelectric element to transmit vibration generated from the piezoelectric element to the outside.

2. A piezoelectric vibrator comprising:
   a piezoelectric element including:
   an N-layer stacked structure including a plurality of first piezoelectric element layers where bisected top electrodes are formed and a plurality of second piezoelectric element layers where internal ground electrodes are formed, the first piezoelectric element layers and the second piezoelectric element layers being alternately stacked in sequence; and
   an M-layer stacked structure provided under the N-layer stacked structure, the M-layer stacked structure having a plurality of third piezoelectric element layers where internal bisected electrodes are formed symmetrical with the top electrodes of the first piezoelectric element of the N-layer stacked structure with respect to a stack plane, and a plurality of second piezoelectric element layer stacked on the N-layer stacked structure, the third piezoelectric element layers and the second piezoelectric element layers being alternately stacked downward in sequence, the third piezoelectric element layer being disposed at the lowermost of the M-layer stacked structure;

a side electrode including:

first and second side electrodes for electrically connecting electrode patterns disposed in a diagonal direction among the electrode patterns formed in the N-layer and M-layer stacked structures of the piezoelectric element; and a third side electrode for electrically connecting the internal ground electrodes of the N-layer and M-layer stacked structures and the bottom electrode of the M-layer stacked structure; and a power transmission member formed in one side of the piezoelectric element to transmit vibration generated from the piezoelectric element to the outside.

3. The piezoelectric vibrator according to claim 1, wherein each of the top electrode and the internal electrode of the piezoelectric element comprises a bent pattern such that one ends adjacent to one another among the bisected patterns extend up to an outside of the piezoelectric element in an opposite direction from a center portion of the piezoelectric element.

4. The piezoelectric vibrator according to claim 3, wherein portions of the internal ground electrode and the bottom electrode of the piezoelectric element extend up to the outside of the piezoelectric element.

5. The piezoelectric vibrator according to claim 4, wherein predetermined portions of the internal ground electrode and the bottom electrode extend up to an edge of the piezoelectric element, the third side electrode being formed in a lateral end of the piezoelectric element.

6. The piezoelectric vibrator according to claim 4, wherein predetermined portions of the internal ground electrode and the bottom electrode extend up to a lateral end of the piezoelectric element, the third side electrode being formed in the same side as the side where the first or second side electrode is formed.

7. The piezoelectric vibrator according to claim 1, wherein each of the top electrode and the internal electrode of the piezoelectric element comprises a bent pattern such that one ends adjacent to one another among the bisected patterns extend up to an outside of the piezoelectric element in an opposite direction from a center portion of the piezoelectric element, and another ends that are not adjacent to one another extend up to an outside of the piezoelectric element.

8. The piezoelectric vibrator according to claim 7, wherein the internal ground electrode and the bottom electrode of the piezoelectric element extend up to lateral outsides of the piezoelectric element, and the third side electrode is formed in the same side as the side where the first or second side electrode is formed.

9. The piezoelectric vibrator according to claim 3, wherein the bent pattern is bent at a right angle.

10. The piezoelectric vibrator according to claim 7, wherein the bent pattern is bent at a right angle.

11. The piezoelectric vibrator according to claim 3, further comprising:

a solder dot for applying an electric signal to nodal points of the top electrode and the bottom electrode of the piezoelectric element.

12. The piezoelectric vibrator according to claim 7, further comprising:

a solder dot for applying an electric signal to nodal points of the top electrode and the bottom electrode of the piezoelectric element.

13. The piezoelectric vibrator according to claim 11, further comprising:

a solder dot for applying an external AC voltage the bent portion of the top electrode of the piezoelectric element.

14. The piezoelectric vibrator according to claim 12, further comprising:

a solder dot for applying an external AC voltage to the bent portion of the top electrode of the piezoelectric element.

15. The piezoelectric vibrator according to claim 13, further comprising:

a solder dot for applying an external AC voltage to the center portion of the bottom electrode of the piezoelectric element.

16. The piezoelectric vibrator according to claim 14, further comprising:

a solder dot for applying an external AC voltage to the center of the bottom electrode of the piezoelectric element.

17. The piezoelectric vibrator according to claim 1, comprising:

wherein the side electrode extends to an inside of the side where the bottom electrode is not formed, without contacting the bottom electrode, such that solder dots are formed on the bottom surface of the piezoelectric element to apply an external AC voltage.

18. The piezoelectric vibrator according to claim 17, wherein the external AC voltage is applied using an FPCB, the FPCB being connected to the solder dots formed on the bottom surface of the piezoelectric element.

19. The piezoelectric vibrator according to claim 2, wherein the N-layer stacked structure comprises four or more even number of the piezoelectric elements, and the M-layer stacked structure comprises three or more odd number of the piezoelectric elements.

* * * * *